United States Patent [19]

Usami

[11] Patent Number: 5,208,178
[45] Date of Patent: May 4, 1993

[54] MANUFACTURING A SEMICONDUCTOR INTEGRATED CIRCUIT DEVICE HAVING ON CHIP LOGIC CORRECTION

[75] Inventor: Mitsuo Usami, Akishima, Japan

[73] Assignee: Hitachi, Ltd., Tokyo, Japan

[21] Appl. No.: 738,570

[22] Filed: Jul. 31, 1991

[30] Foreign Application Priority Data

Aug. 2, 1990 [JP] Japan .................................. 2-205590
Nov. 29, 1990 [JP] Japan .................................. 2-332604

[51] Int. Cl.⁵ .......................................... H01L 21/66
[52] U.S. Cl. .......................................... 437/51; 437/8; 437/925
[58] Field of Search .................. 437/7, 8, 48, 51, 925, 437/974; 148/DIG. 162; 324/73.1, 158 R, 158 T

[56] References Cited

U.S. PATENT DOCUMENTS

| | | | |
|---|---|---|---|
| 4,924,589 | 5/1990 | Leedy | 437/8 |
| 4,954,453 | 9/1990 | Venutolo | 437/8 |
| 5,037,771 | 8/1991 | Lipp | 437/51 |
| 5,039,602 | 8/1991 | Merrill et al. | 437/51 |

FOREIGN PATENT DOCUMENTS 0147746 7/1987 Japan .

OTHER PUBLICATIONS

Nikkei Microdevice ..., Nikkei MacGraw-Hill, pp. 45 and 46, Apr. 1986.
IEEE Journal of Solid-. . . , vol. SC-21, No. 4, Oct. 1986, "Silicon Hybrid Wafer-Scale ... ", pp. 845-851.

*Primary Examiner*—Brian E. Hearn
*Assistant Examiner*—C. Chaudhari
*Attorney, Agent, or Firm*—Antonelli, Terry, Stout & Kraus

[57] ABSTRACT

The present invention relates to a logic correction for a random logic IC of a high integration density, and more particularly to an on-chip logic correction method wherein the upper surface of a chip is divided into a large number of macrocells, testing of the macrocells is made and each defective macrocell is corrected by replacement. Testing is performed after a primary wiring process that connects semiconductor elements into macrocells but before a secondary wiring process interconnecting the macrocells. After the testing, defective macrocells are replaced, and thereafter the secondary wiring process is performed. Testing is performed using testing pads in each macrocell, connected to the main circuit portion of the macrocell through shift register circuit portions. The macrocells are arranged in a lattice pattern. Wirings formed in the secondary wiring process have a larger cross-sectional area than wirings formed in the primary wiring process.

45 Claims, 25 Drawing Sheets

| OPERATION MODE \ WIRING | TM | OS |
|---|---|---|
| SHIFT-IN MODE | H | L |
| OUTPUT DATA SETTING MODE | H | H |
| SHIFT-OUT MODE | H | L |

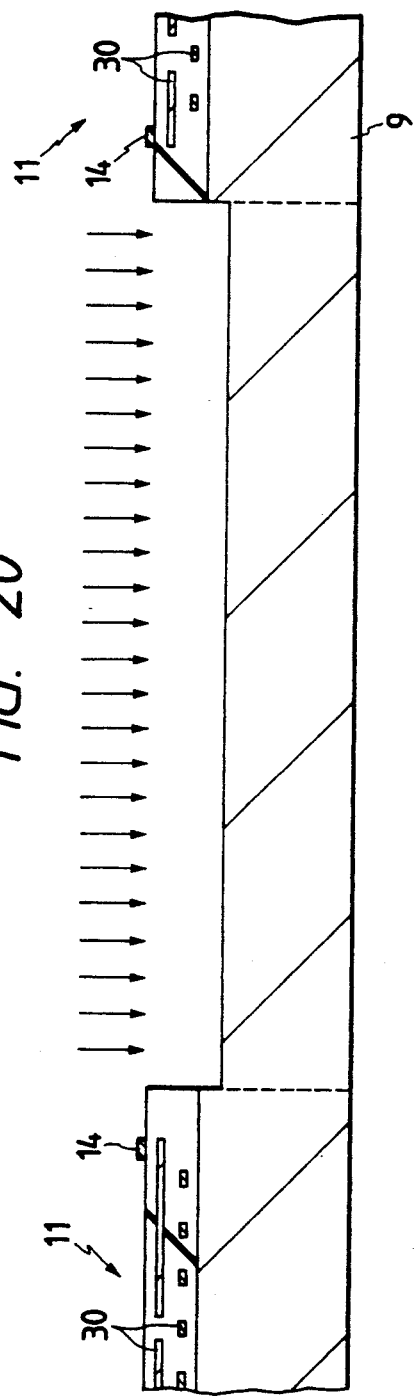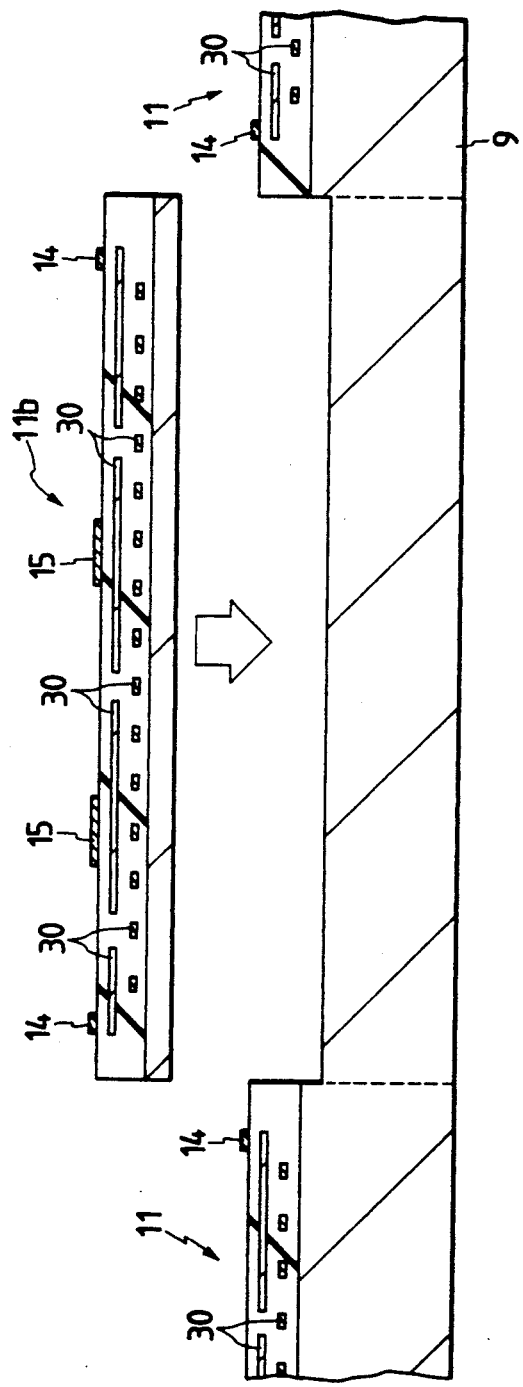

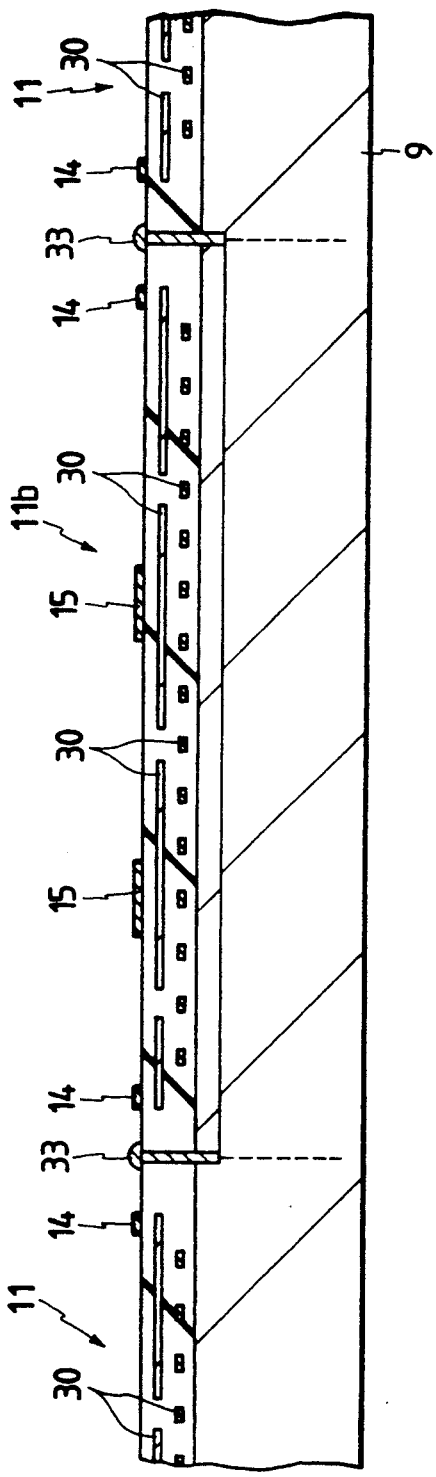
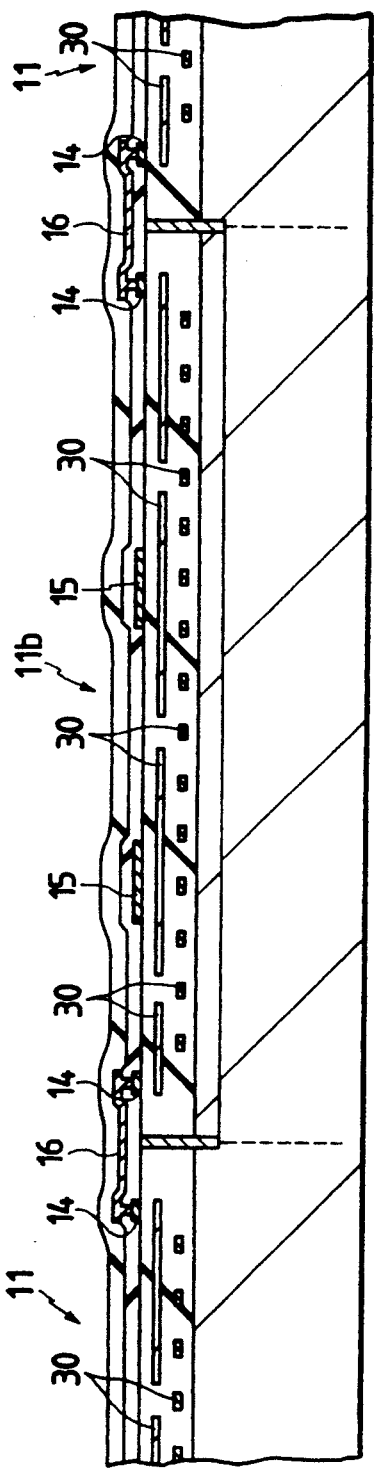

MANUFACTURING A SEMICONDUCTOR INTEGRATED CIRCUIT DEVICE HAVING ON CHIP LOGIC CORRECTION

BACKGROUND OF THE INVENTION

The present invention relates to a technique for manufacturing semiconductor integrated circuit devices, particularly to a technique for remedying defects, or a redundancy technique, in a semiconductor integrated circuit device, and to the device manufactured by such technique.

As conventional techniques for remedying defects in a semiconductor wafer (hereinafter referred to as a "wafer")-scale LSI (large-scale integrated circuit) there are those described in, for example, (1) "Nikkei Microdevice April 1986 Number", Nikkei MacGraw-Hill, Inc. (Apr. 1, 1986), pp. 45 and 46, (2) IEEE JOURNAL OF SOLID-STATE CIRCUITS, Vol. SC-21, No. 5, October 1986—"Silicon Hybrid Wafer-Scale Packaged Technology", pp. 845–851, and (3) Japanese Patent Laid Open No. 147746/87.

In the above literatures (1) and (2) there are made explanations about a technique for remedying defects in a wafer-scale integrated circuit (hereinafter referred to as WSI (Wafer Scale Integration). This technique will now be outlined. First, a defective chip region in each chip region on a wafer is removed, and a hole, which is square-shaped in plan and extends through a main surface and to the back of the wafer, is formed in the removed region. Then, the wafer is placed on a predetermined base with the main surface thereof facing downwards. Subsequently, a semiconductor chip (hereinafter referred to as a "chip") free of defects is inserted into the hole formed in the wafer with the main surface thereof facing downwards. The size of the good chip thus disposed in the hole is, say, 4.98 mm square. Thereafter, the gap between the good chip and the wafer is filled with an epoxy resin, for example. Lastly, the wafer is turned upside down and pads of the good chip and pads in the good chip region on the wafer are wire-connected to form a WSI.

Also in the foregoing literature (3) there is described a technique for remedying defects of a WSI. An outline of this technique is as follows. Like the technique described in the literatures (1) and (2), a defective chip region on a wafer is removed and a good chip is embedded in the removed region. Thereafter, chips are wire-connected to form a WSI.

SUMMARY OF THE INVENTION

Recently, increase of capacity and upgrading of function have been made in semiconductor integrated circuit devices. At the same time, there has been an increase in integration density of devices and increase in size of chips. However, with increase in size of each chip, the number of chips which can be formed on a wafer becomes smaller. Besides, as the chip size and the device integration density are increased, the percent occurrence of defects caused by dust particle becomes higher. As a result, the number of good chips obtained from a single wafer is reduced markedly. In other words, with increase in capacity and upgrading of function of semiconductor integrated circuit devices, it will become very difficult to ensure a chip yield which pays well. For example, in a semiconductor integrated circuit device of high integration density, the probability of manufacturing a chip of 20 mm square or so in a state defect density state of one piece/cm$^2$, without causing any defect, is $Y \approx e^{-4} = 2\%$. However, such probability cannot be applied to actual production at all. Particularly, in an extremely low yield stage at an early stage of development, such as in a mask debugging stage of a logical LSI, namely in a logical check stage, it is very difficult to provide chips in a number as large as possible to confirm the reliability thereof. Consequently, it is inevitably required to degrade the performance of an integrated circuit in order to ensure the chip yield. From this standpoint, in what manner a redundancy of high certainty is to be realized will be an important subject in the future with respect to semiconductor integrated circuit devices.

In connection with semiconductor integrated circuit devices, moreover, there have been made development and manufacture of custom products such as ASIC, for example. In such a custom product as ASIC, chips are mainly fabricated in accordance with a specification requested by a user, and in a number also requested by the user. Usually, therefore, although the number of kinds of products increases, the production volume of each kind does not increase. In other words, decreased cost of the product, based on the effect of mass production, cannot be expected, and the cost of the product depends greatly on the chip yield. Therefore, in order to ensure a chip yield which pays well, it is necessary to adopt a redundancy technique of high certainty as in the foregoing case. In the case of custom products, however, since the state of wiring connection also changes if the kind of product changes, the mode of defect also varies depending on the kind of product. Consequently, every time the kind of product changes, it is necessary to analyze the cause of the defect, and hence the defect remedying operation is very difficult. It is more difficult to make such analysis after the fabrication of the chip, that is, after the end of the wiring connecting process. Once a chip has been fabricated, it is next to impossible to remedy defects which occurred in the initial stage of the chip fabrication. Under the circumstances, the performance of an integrated circuit must be degraded in order to ensure a high chip yield. From such a standpoint, as a future trend of semiconductor integrated circuit devices, it is an important subject how a redundancy technique of high applicability capable of coping with various chip modifications is to be realized.

In the foregoing conventional techniques (1) to (3), no consideration is given to the redundancy of chip regions, so they are not employable as redundancy techniques for chips.

Taking note of the above subject, the present invention was accomplished, and it is an object of the invention to provide a technique capable of realizing redundancy of high certainty.

It is another object of the present invention to provide a technique capable of realizing redundancy of high applicability.

It is a further object of the present invention to provide a technique capable of improving the chip yield without degrading the performance of an integrated circuit.

It is a still further object of the present invention to provide a technique capable of coping with increase in capacity and upgrading of performance of semiconductor integrated circuit devices.

It is a still further object of the present invention to provide a technique capable of coping with customization of semiconductor integrated circuit devices.

It is a still further object of the present invention to provide a technique wherein chips can be easily and accurately checked for defects, in a simple procedure, at an early stage of the processing.

It is a still further object of the present invention to provide a diagnostic (testing) technique for high-density LSI, wherein chips can be easily and accurately checked for defects at an early stage of the processing.

It is a still further object of the present invention to provide a technique whereby defective cells can be easily replaced with good cells, with the good cells being incorporated into the integrated circuit on the chip.

It is a still further object of the present invention to provide a technique for repairing LSI.

It is a still further object of the present invention to provide a technique whereby interconnections between cells of integrated circuits on a wafer are improved.

It is a still further object of the present invention to provide integrated circuits having interconnections with photo-devices (e.g., photodiodes).

The above and other objects and novel features of the present invention will become apparent from the following description and the accompanying drawings.

Out of the various aspects of the present invention disclosed herein, typical ones will be outlined below. Such typical aspects of the present invention are illustrative and not limiting. In all aspects of the present invention, the present invention resides not only in the method of forming the semiconductor integrated circuit device, but also resides in the semiconductor integrated circuit device formed.

The first aspect of the present invention resides in a method for manufacturing a semiconductor integrated circuit device wherein predetermined semiconductor integrated circuit elements are formed in each chip region on a wafer; then a plurality of macrocells having the same circuit function are arranged regularly in the chip region by a primary wiring process; test pads connected to a main circuit portion in each macrocell through a shift register circuit portion formed in the interior of the macrocell are arranged regularly in the macrocell; subsequently, at the time of checking electrical characteristics of each macrocell in the chip region, check data which have been inputted in series through the test pads are converted into parallel signals through the shift register circuit portion, then the parallel signals are inputted to the main circuit portion; then detection data outputted in parallel from the main circuit portion in accordance with the check data are converted into serial signals through the shift register circuit portion; the serial signals are outputted to the test pads; then the detection data thus outputted are compared with an expected value to judge whether the macrocell is good or bad; a macrocell quality information is prepared on the basis of the results of the judgement; a defective macrocell is removed on the basis of the quality information; thereafter, a good macrocell is embedded in the removed region; and the macrocells in the chip region are interconnected by a secondary wiring process to form a predetermined semiconductor integrated circuit in the chip region.

The second aspect of the present invention resides in a method for manufacturing a semiconductor integrated circuit device wherein the aforementioned macrocells are arranged latticewise in each chip region, and plural such macrocells positioned on the same straight line are checked simultaneously.

The third aspect of the present invention resides in a method for manufacturing a semiconductor integrated circuit device wherein the foregoing good macrocell is obtained from the wafer tested.

The fourth aspect of the present invention resides in a method for manufacturing a semiconductor integrated circuit device wherein at the time of embedding a good macrocell in the defective macrocell removed region (that is, the region where the defective macrocell is removed), the surface of the good macrocell is set at the same height as the surfaces of the surrounding macrocells.

The fifth aspect of the present invention resides in a method for manufacturing a semiconductor integrated circuit device wherein at the time of embedding a good macrocell in a defective macrocell removed region, a metal or a compound thereof is embedded in the space between the good macrocell and the surrounding macrocells to fix the good macrocell in the defective macrocell removed region, and thereafter the upper portion of the embedded metal or compound thereof is flattened in conformity with the macrocell surface.

The sixth aspect of the present invention resides in a method for manufacturing a semiconductor integrated circuit device wherein the sectional area of the wiring which interconnections the macrocells is made larger than that of the intra-macrocell wiring.

The seventh aspect of the present invention resides in a method for manufacturing a semiconductor integrated circuit device wherein macrocells formed in each chip region of a semiconductor wafer of an SOI structure provided with an insulating layer between semiconductor layers are tested for electrical characteristics, and a main surface-side of the semiconductor wafer down to the insulating layer is formed in the outer periphery of a defective macrocell on the basis of the results of the test; and using photolithography techniques, a back-side dividing trench extending from the back side of the semiconductor wafer up to the said main surface-side dividing trench is formed; the defective macrocell is taken out through those processes; and thereafter a good macrocell which has been taken out from the semiconductor wafer or from another semiconductor wafer of SOI structure in the same manner as in the above method of taking out the defective macrocell is positioned and fixed in the defective macrocell removed region.

The eighth aspect of the present invention resides in a method for manufacturing a semiconductor integrated circuit device wherein predetermined semiconductor integrated circuit elements are formed in each chip region on a wafer; then a plurality of macrocells having the same circuit function are arranged regularly in the chip region by a primary wiring process; test pads connected to a main circuit portion in each macrocell through a shift register circuit portion formed in the interior of the macrocell are arranged regularly in the macrocell; subsequently, at the time of checking electrical characteristics of each macrocell in the chip region, check data which have been inputted in series through the test pads are converted into parallel signals through the shift register circuit portion, then the parallel signals are inputted to the main circuit portion; then detection data outputted in parallel from the main circuits in accordance with the check data are converted into serial signals through the shift register circuit portion; the serial signals are outputted to the test pads; macrocell information is prepared on the basis of the outputted detection data; a predetermined macrocell is removed on the basis of the macrocell information, and thereafter a macrocell having a different circuit function is embedded in the predetermined removed region; and the macrocells in the chip region are interconnected by a secondary wiring process to form a predetermined semiconductor integrated circuit in the chip region.

The ninth aspect of the present invention resides in a method for manufacturing a semiconductor integrated circuit device wherein on the main surface side of a wafer a main surface-side dividing trench is formed around the macrocells by a high accuracy processing, while on the back side of the wafer a back-side dividing trench is formed by a low accuracy processing, in removing a macrocell.

The tenth aspect of the present invention resides in a method for manufacturing a semiconductor integrated circuit device wherein, before forming an intramacrocell wiring for the formation of plural macrocells in each chip region of a wafer of SOI (semiconductor, e.g., silicon on insulator) structure, a main surface-side dividing trench forming member extending from the main surface side of the wafer up to an insulating layer formed inside the wafer is provided beforehand in the outer periphery of each macrocell formed in the chip region, and the main surface-side dividing trench forming member is removed in a macrocell removing process to thereby form a main surface-side dividing trench extending from the main surface side of the wafer down to the insulating layer formed in the interior of the wafer.

The eleventh aspect of the present invention resides in a method for manufacturing a semiconductor integrated circuit device wherein by the main surface-side and back-side dividing trenches formed around the macrocells there are formed dividing trenches for positional accuracy between good and defective macrocells.

According to the first aspect of the present invention outlined above, it becomes possible to remove only a defective portion from the chip region and correct it easily in an early stage of the wafer process, that is, in the stage of high percent occurrence of defects because of fineness and high integration density. Consequently, it is possible to effect the following, for example. First, macrocells are formed in each chip region up to the primary wiring process by an up-to-date processing technique. Then, in the event of occurrence of a defective macrocell, it is removed. Subsequently, in the defective macrocell removed region there is disposed a good macrocell which has been fabricated by an up-to-date processing technique. By so doing, it is possible to effect a redundancy operation certainly without degrading the performance of a semiconductor integrated circuit, thus resulting in that it becomes possible to improve the chip yield. Further, since correction of the defect is made prior to the formation of a predetermined semiconductor integrated circuit in each chip region, that is, before the chip region comes to have the function as the predetermined semiconductor integrated circuits, and just after the finding of the defect, it is possible to realize a redundancy technique high in both applicability and certainty.

According to the second aspect of the present invention outlined above, since plural macrocells are tested simultaneously, it is possible to check all of the macrocells in each chip region in a short time.

According to the third aspect of the present invention outlined above, by obtaining a good macrocell for replacement to be embedded in the defective macrocell removed region, from the same wafer, it is possible to approximate electrical characteristics of elements, etc. between that good macrocell and the other macrocells in the chip region.

According to the fourth aspect of the present invention outlined above, since the surface of a good macrocell for replacement embedded in the defective macrocell removed region and the surfaces of the surrounding macrocells are set at the same height, there occurs no difference in height caused by the difference in the surface level between the good macrocell for replacement and the surrounding macrocells. Consequently, it becomes possible to prevent the breaking, caused by such difference in surface height, of the wiring which interconnects the macrocells.

According to the fifth aspect of the present invention outlined above, since the upper portion of the material embedded in the trench between the good macrocell for replacement embedded in the defective macrocell removed region and the surrounding macrocells is flattened, there does not occur a difference in height caused by the material embedded in the trench. Consequently, it is possible to prevent the breaking of the intercell wiring caused by the difference in height.

According to the sixth aspect of the present invention outlined above, since the sectional area of the intercell wiring which interconnects the macrocells is made larger than that of the intra-cell wiring, it is possible to suppress the increase in wiring resistance of an intercell wiring which is relatively long. In other words, it is possible to suppress the wiring delay. Besides, since the dust particle sensitivity of intercell wiring is mitigated, it is possible to diminish the occurrence of defective wiring in the secondary wiring process.

According to the seventh aspect of the present invention outlined above, since the main surface-side dividing trench is formed with the accuracy of the photolithographic technique, the external size accuracy, etc. of the defective macrocell removed region or of the good macrocell can be made extremely high, and it is possible to improve the reproducibility of such sizes. Moreover, at the time of forming the back-side dividing trench by etching, if the insulating layer in the wafer of SOI structure is used as a stopper layer, there will be no deterioration in dimensional accuracy of the main surface-side dividing trench. That is, at the time of forming the back-side dividing trench, there will be no deterioration in dimensional accuracy of the defective macrocell removed region or that of the good macrocell. Further, since the processing accuracy of the back-side dividing trench is lower than that on the main surface side, it becomes possible to effect processing to a rougher extent as compared with the processing for the main surface-side dividing trench and thus there arises room for selection also with respect to the processing method.

According to the eighth aspect of the present invention outlined above, by disposing a macrocell having a different circuit function in the chip region it becomes possible to change the logic of the semiconductor integrated circuit or expand the function of the same circuit.

BRIEF DESCRIPTION OF THE DRAWINGS

FIG. 20 is a sectional view of the principal portion of the wafer in a defective macrocell removing process;

FIG. 21 is a sectional view of the principal portion of the wafer in which a macrocell for replacement is about to be disposed in the defective macrocell removed region;

FIG. 22 is a sectional view of the principal portion of the wafer, showing an embedded state of the replacement macrocell in the defective macrocell removed region;

FIG. 23 is a sectional view of the principal portion of the wafer just after the end of a secondary wiring process;

DETAILED DESCRIPTION OF THE INVENTION

Embodiment 1

Figure 1:
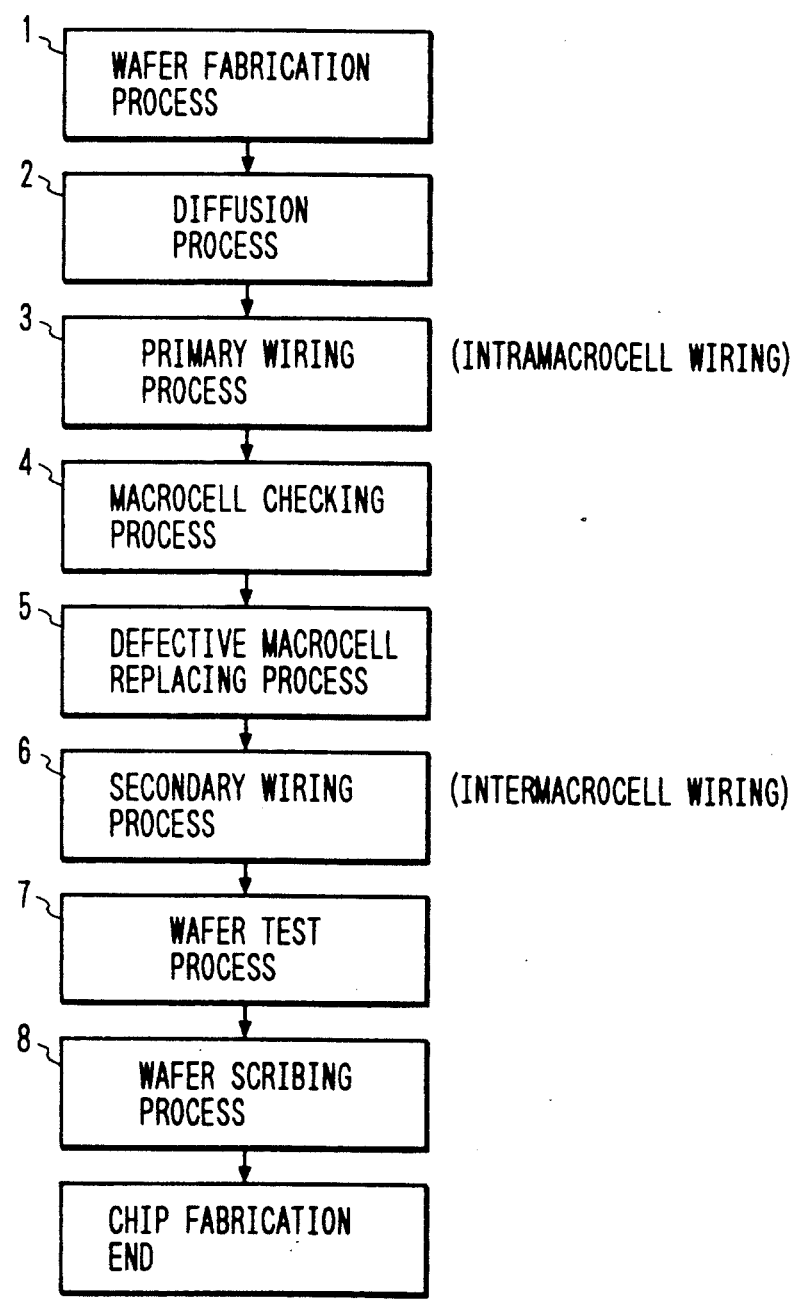
FIG. 1 is a process chart showing a method for manufacturing a semiconductor integrated circuit device according to an embodiment of the present invention.
Figure 2:
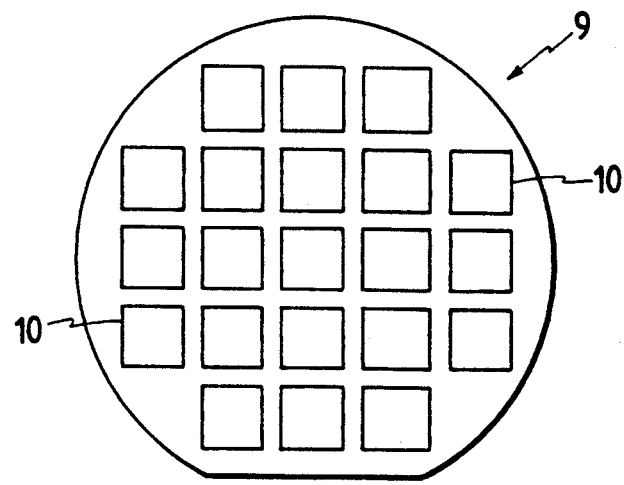
FIG. 2 is an entire plan view of a wafer, showing chip regions after the end of a primary wiring process.
Figure 3:
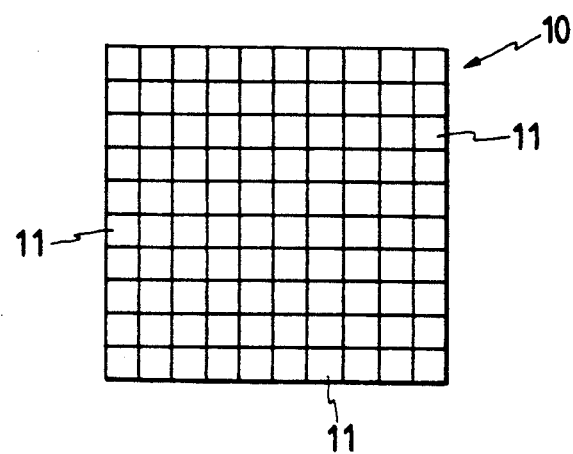
FIG. 3 is an enlarged plan view of each chip region shown in FIG. 2.
Figure 4:
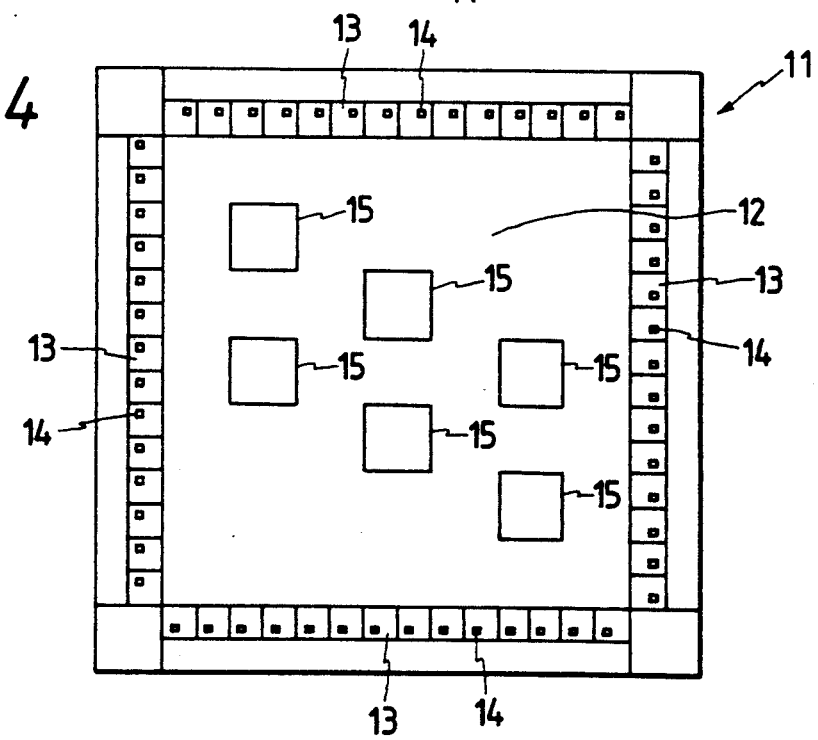
FIG. 4 is an enlarged plan view of a macrocell formed in the chip region shown in FIG. 3.
Figure 5:
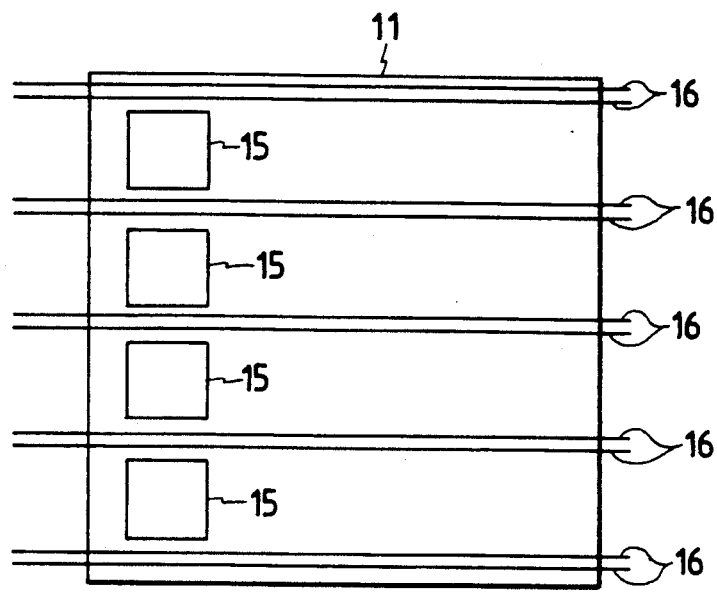
FIGS. 5 and 6 are each an enlarged plan view of a macrocell for explaining the reason why test pads are arranged displacedly.
Figure 6:
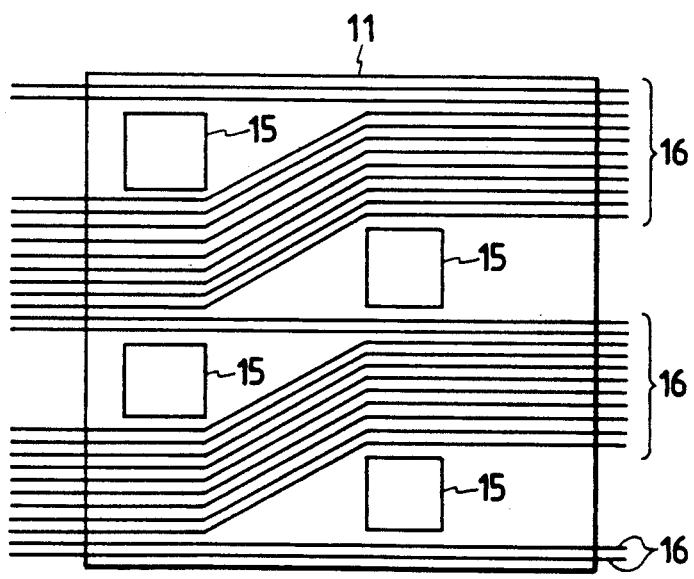
Figure 7:
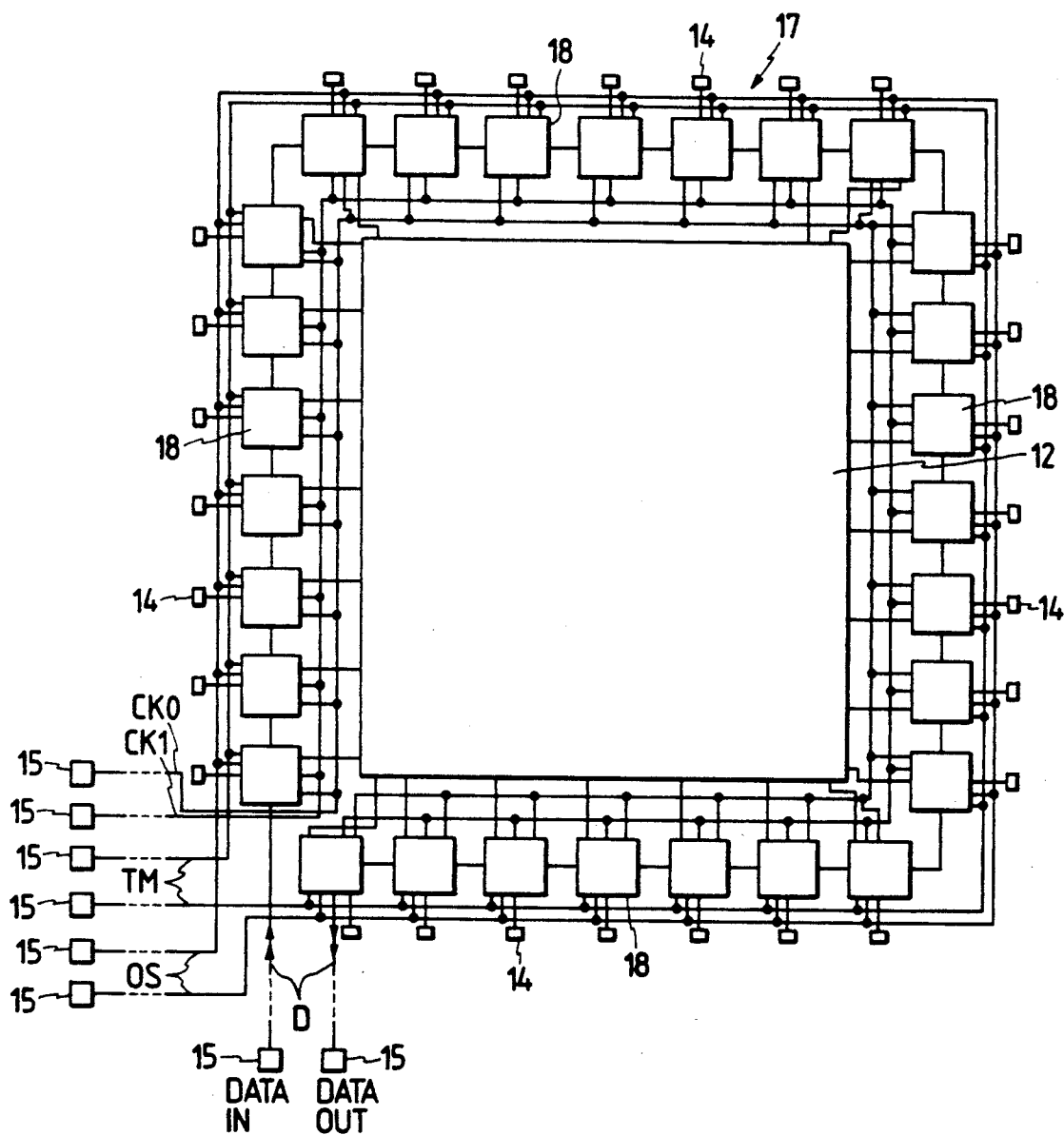
FIG. 7 is a circuit diagram showing a shift register circuit portion formed in the macrocell illustrated in FIG. 4.
Figures 8, 9:
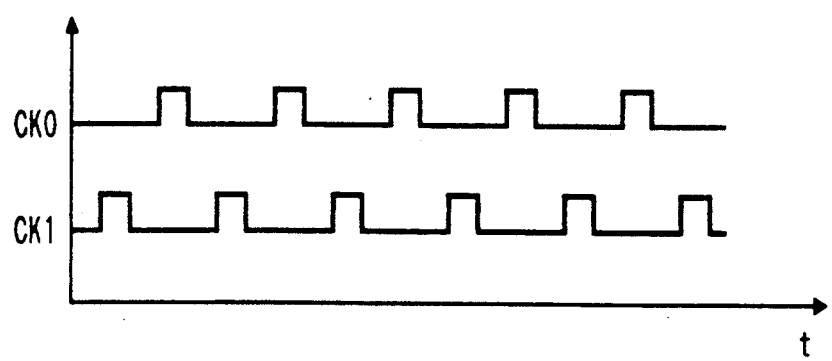
FIG. 8 is a timing chart of clock signals for taking synchronism of the shift register circuit portion.
FIG. 9 is a diagram showing signal levels of control lines during operation of the shift register circuit portion.
Figure 10:
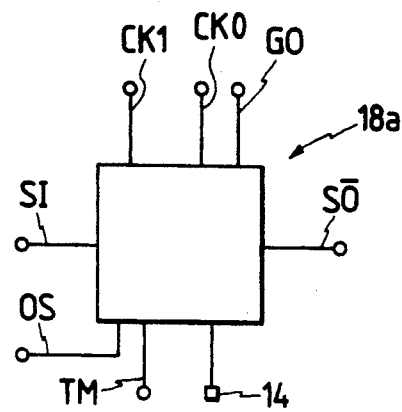
FIG. 10 is a symbolic diagram of an input shift register.
Figure 11:
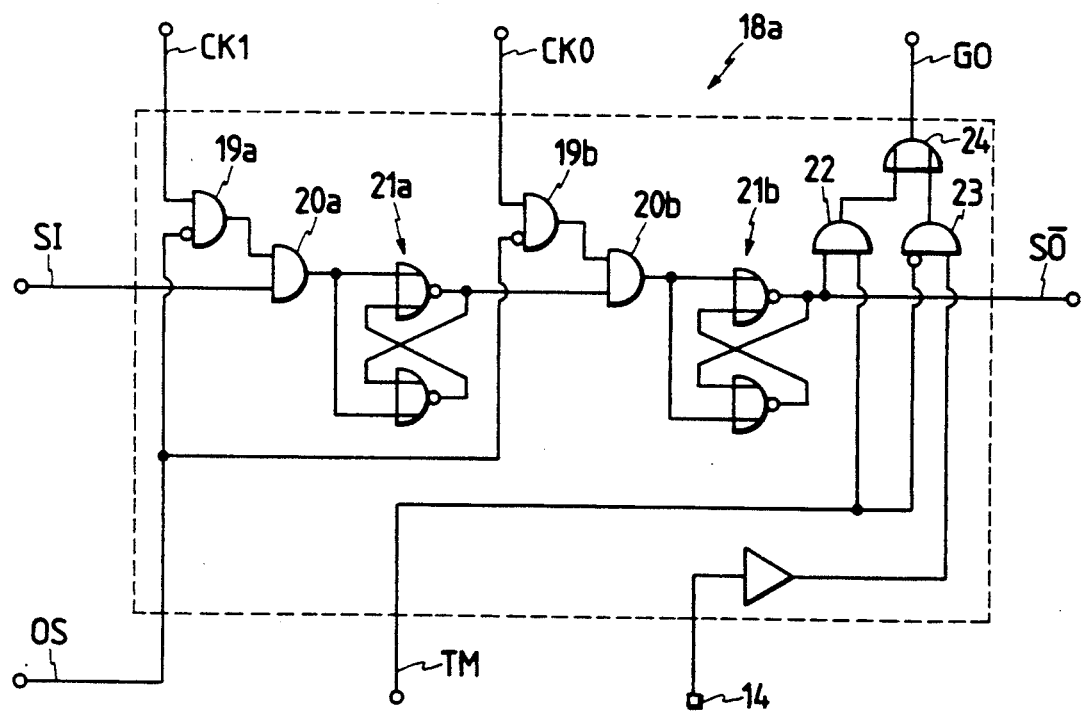
FIG. 11 is an internal circuit diagram of the input shift register shown in FIG. 10.
Figure 12:
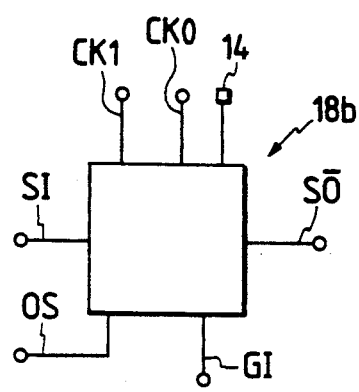
FIG. 12 is a symbolic diagram of an output shift register.
Figure 13:
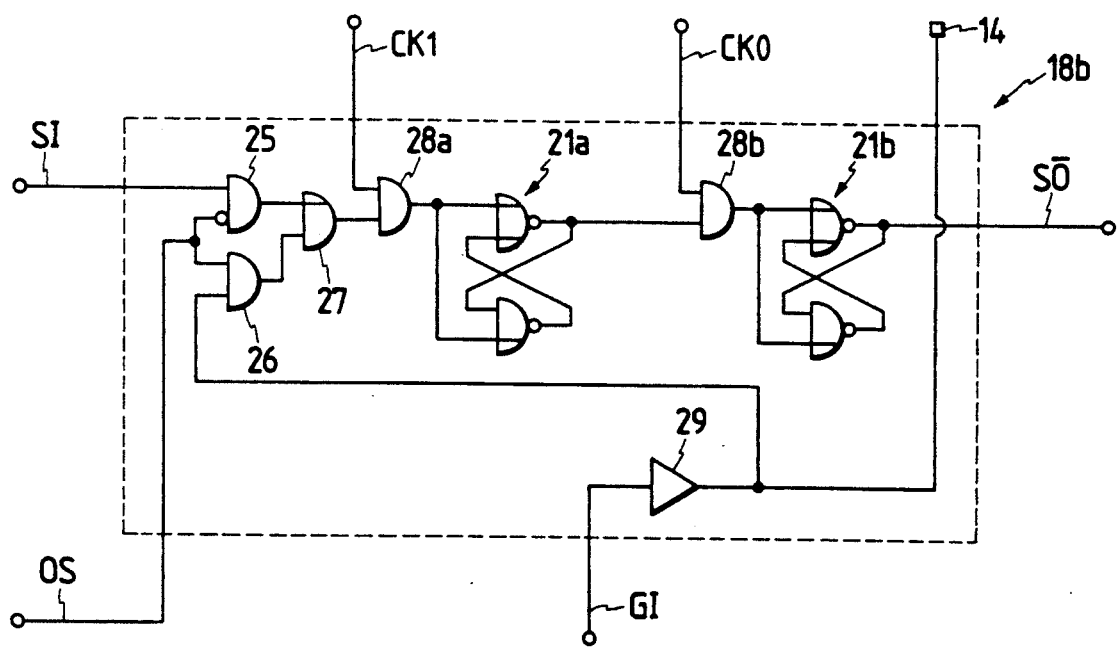
FIG. 13 is an internal circuit diagram of the output shift register shown in FIG. 12.
Figure 14:
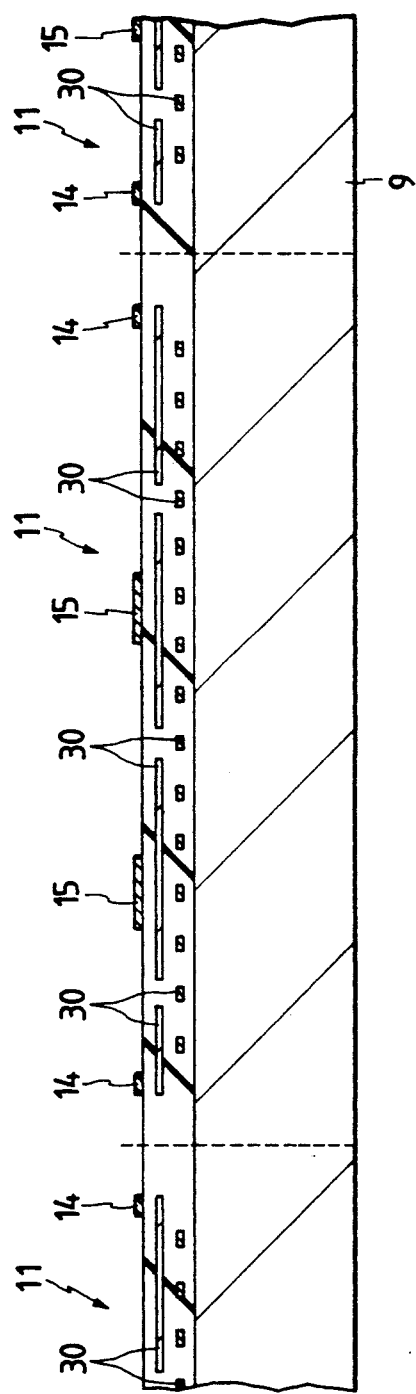
FIG. 14 is a sectional view of a principal portion of a wafer just after the end of the primary wiring process.
Figure 15:
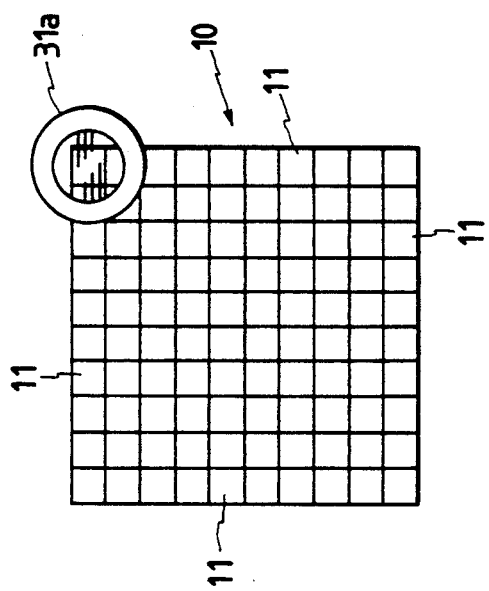
FIG. 15 is an enlarged plan view of a chip region in a macrocell inspecting process.
Figure 16:
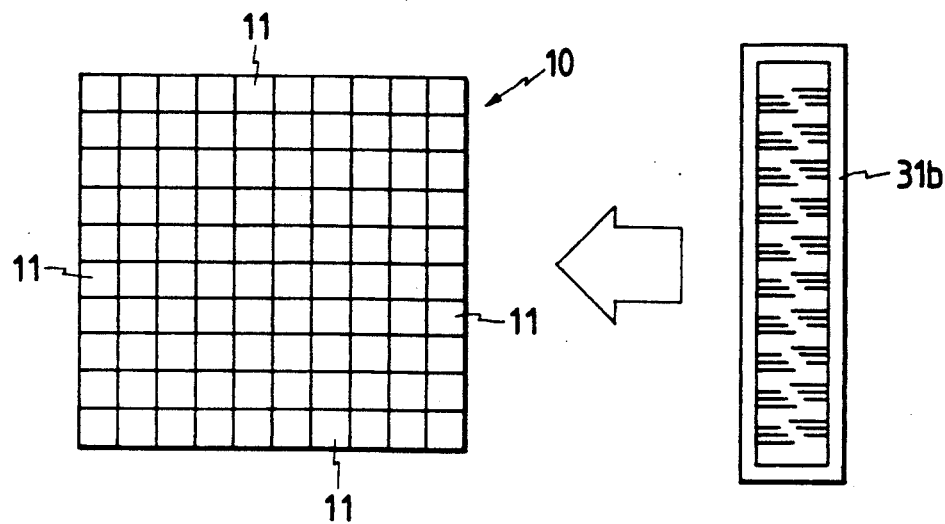
FIG. 16 is an enlarged plan view of a chip region, showing a modification of a macrocell inspecting method.
Figure 17:
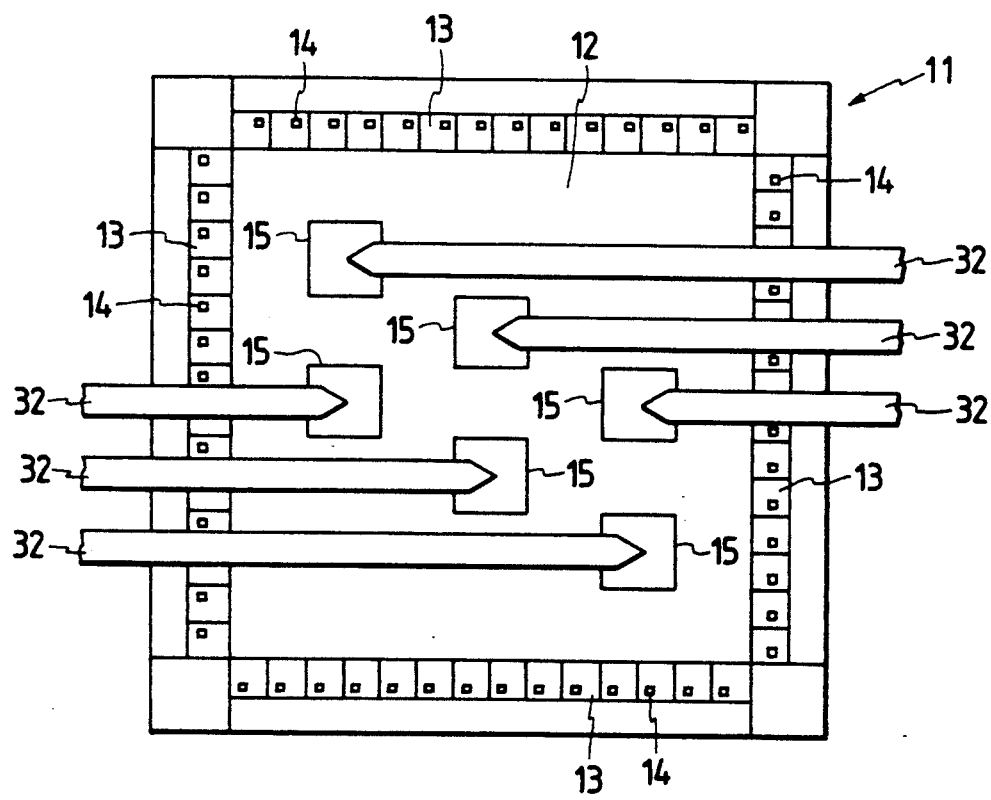
FIG. 17 is an enlarged plan view of a macrocell in the macrocell inspecting process.
Figure 18:
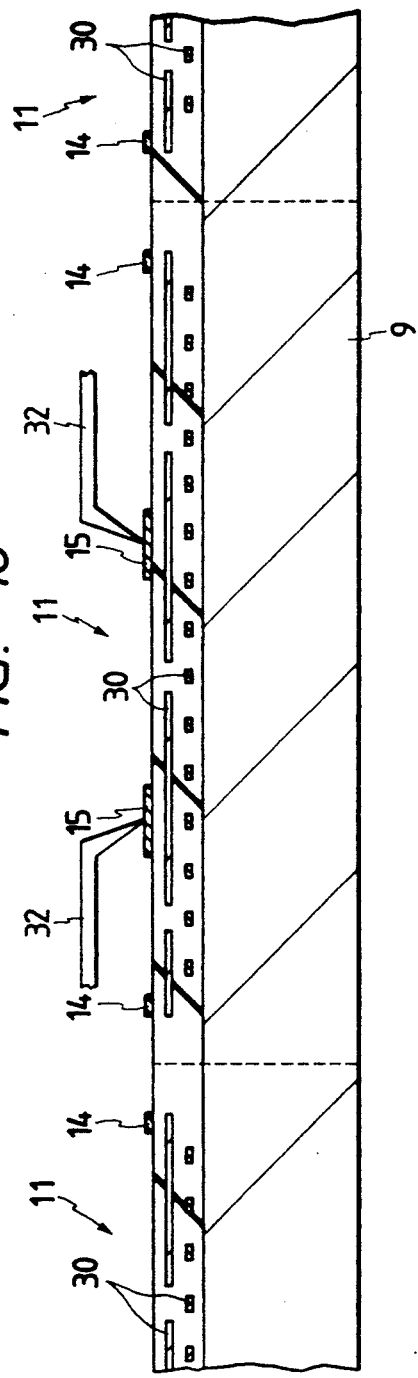
FIG. 18 is a sectional view of a principal portion of the wafer in the macrocell inspecting process.
Figure 19:
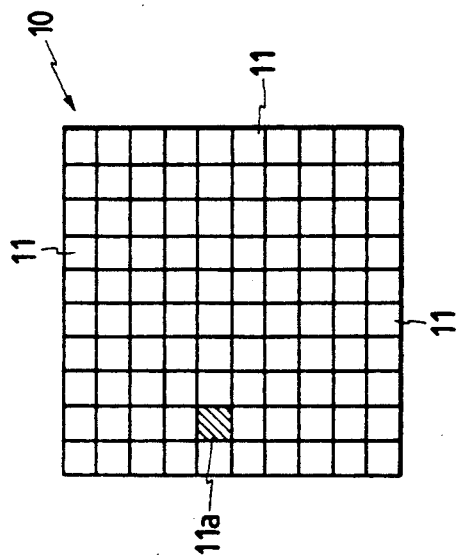
FIG. 19 is an enlarged plan view of a chip region, showing a defective macrocell.

FIG. 1 is a process chart showing a method for manufacturing a semiconductor integrated circuit device according to an embodiment of the present invention; FIG. 2 is an entire plan view of a wafer, showing chip regions just after the end of a primary wiring process; FIG. 3 is an enlarged plan view of each chip region shown in FIG. 2; FIG. 4 is an enlarged plan view of a macrocell formed in the chip region shown in FIG. 3; FIGS. 5 and 6 are each an enlarged plan view of a macrocell for explaining the reason why test pads are arranged displacedly; FIG. 7 is a circuit diagram showing a shift register circuit portion formed in the macrocell illustrated in FIG. 4; FIG. 8 is a timing chart of clock signals for taking synchronism of the shift register circuit portion; FIG. 9 is a diagram showing signal levels of control lines during operation of the shift register circuit portion; FIG. 10 is a symbolic diagram of an input shift register; FIG. 11 is an internal circuit diagram of the input shift register shown in FIG. 10; FIG. 12 is a symbolic diagram of an output shift register; FIG. 13 is an internal circuit diagram of the output shift register shown in FIG. 12; FIG. 14 is a sectional view of a principal portion of a wafer just after the end of the primary wiring process; FIG. 15 is an enlarged plan view of a chip region in a macrocell inspecting process; FIG. 16 is an enlarged plan view of a chip region, showing a modification of a macrocell inspecting method; FIG. 17 is an enlarged view of a macrocell in the macrocell inspecting process; FIG. 18 is a sectional view of a principal portion of the wafer in the macrocell inspecting process; FIG. 19 is an enlarged plan view of a chip region, showing a defective macrocell; FIG. 20 is a sectional view of the principal portion of the wafer in a defective macrocell removing process; FIG. 21 is a sectional view of the principal portion of the wafer in which a good macrocell is about to be disposed in the defective macrocell removed region; FIG. 22 is a sectional view of the principal portion of the wafer, showing an embedded state of the good macrocell in the defective macrocell removed region; and FIG. 23 is a sectional view of the principal portion of the wafer just after the end of a secondary wiring process.

The following description is now provided about a method for fabricating a logical LSI chip according to embodiment 1. It is to be appreciated that the semiconductor integrated circuit to be formed is not limited to a logical LSI,d but various changes may be made.

FIG. 1 shows the semiconductor integrated circuit device manufacturing process of embodiment 1. For example, this process comprises eight processing techniques, which are a wafer fabrication process 1, diffusion process 2, primary wiring process 3, macrocell inspecting process 4, defective macrocell replacing process 5, secondary wiring process 6, wafer test process 7, and wafer scribing process 8.

First, an explanation will be given below about a wafer just after the end of the primary wiring process 3 and also about chip regions formed on the wafer, with reference to FIGS. 1 to 11.

A wafer after the end of the primary wiring process 3 is shown in FIG. 2. For example, the wafer, indicated at 9, is formed of single crystal silicon (Si). The diameter of the wafer 9 is, say, 6 inches or so. On a main surface of the wafer 9 there are arranged thirty-two chip regions 10 for example. The size of each chip region 10 is 20 mm × 20 mm for example.

FIG. 3 is an enlarged plan view of the chip region 10. For example, 400 macrocells 11 are arranged in the form of a lattice in each chip region 10. The size of each macrocell 11 is, say, 1 mm × 1 mm. In each macrocell 11 there is formed an intra-cell circuit (a main circuit portion) having the same function, provided at this stage the macrocells 11 are not interconnected by wiring. That is, the intra-cell circuits formed in the macrocells 11 are independent of one another. In this embodiment 1, though not shown in the drawings, an insulator for electrical isolation between semiconductor integrated circuit elements of the macrocells 11 is formed on the outer periphery of each macrocell 11.

FIG. 4 is an enlarged plan view of each macrocell 11. Centrally of the macrocell 11 is formed an intra-cell circuit region 12 for example. In the intra-cell circuit region 12 is formed an intra-cell circuit such as a gate array of, say, 3K gates. As can be appreciated, the intra-cell circuit is not limited to a gate array, but various changes may be made. For example, the intra-cell circuit may be a circuit having SRAM (Static RAM) of 16 Kb to 64 Kb or analog function. In the outer periphery of the intra-cell circuit region 12 there are arranged a plurality of input-output circuit regions 13. In each input-output region 13 there is formed a predetermined input-output circuit such as an input-output buffer, for example, and there also is disposed a pad 14. The pads 14 are for interconnection of the macrocells 11 in the secondary wiring process 6 which will be described later. The number, N, of the pads 14 is, for example, $N = 1.9\ G^{0.6}$ in accordance with Lenz's law if the number of gates is G. For example, if $G = 300$, $N = 232$. Thus, at least 232 pads 14 are formed in each macrocell 11.

According to this embodiment 1, in the macrocell inspecting process 4 which will be described later, each macrocell 11 is checked for electrical characteristics by means of a wafer prober or the like. However, in the macrocell 11 which is as fine as 1 mm square, it is impossible to bring probes into abutment with 232 pads 14. This is also the case even in the use of an EB (Electron Beam) tester. In this embodiment 1, this problem is solved by the application of a scan test method. The general scan test method will not be explained here because it is described in, for example, "Custom LSI Application Design Handbook," REALIZE INC. (Feb. 29, 1984), pp. 150–154, and Japanese Patent Laid Open No. 69349/82. Thus, while the general scan test was known, the present invention applies such general scan test to super device integration (SDI).

In this embodiment 1, a shift register circuit portion which will be described later is interposed between test pads 15 and the intra-cell circuit. As a result, electrical characteristics of the intra-cell circuit can be checked through a small number (e.g., 5–11) of test pads 15. The test pads 15 and the shift register circuit portion will be explained below in this order.

The test pads 15 are arranged on the intra-cell circuit region 12 of each macrocell 11. For example, the number of the test pads 15 is 5 to 11. In this degree of test pad number, it is possible to form test pads 15 of a size large enough to permit abutment of probes therewith even on a 1 mm square macrocell 11. The size of each test pad 15 is, say, 50 μm × 50 μm. The test pads 15 are arranged regularly on each macrocell 11. Thus, in this embodiment 1, the macrocells 11 are arranged regularly in each chip region 10, and the test pads 15 are arranged regularly in each macrocell 11. As a result, in the inspection of the macrocells 11, it is possible to bring probes into regular abutment with the test pads 15 in each macrocell 11. Thus, the inspection of all the macrocells 11 can be done quickly and efficiently.

In this embodiment 1, moreover, the test pads 15 are arranged displacedly, as shown in FIG. 4. This is for the following reason. In the inspection of each macrocell 11, when probes are brought into abutment with the test pads 15, the upper portions of the test pads are depressed and there arise a difference in height. If intercell lines for connection between macrocells 11 are formed just above the test pads 15, there is a fear of breaking of such intercell lines due to the difference in height at the upper surface of each test pad. This may be prevented by disposing intercell lines 16 above and between test pads 15. However, if the test pads 15 are arranged simply in a row, the space between test pads 15 becomes narrow and the number of intercell lines 16 capable of being disposed therebetween is decreased. In this embodiment 1, as shown in FIG. 6, the spacing between adjacent test pads 15 is kept appropriate by displacing the test pads 15 from one another. As a result, the number of intercell lines 16 capable of being formed between adjacent test pads 15 can be increased.

The shift register circuit portion referred to above will now be described. The shift register circuit portion is disposed along the outer periphery of the input-output circuit region 13 shown in FIG. 13. As illustrated in FIG. 7, the shift register circuit portion, indicated at 17, comprises a plurality of shift registers 18 which are interconnected in series by line D.

Lines CK0 and CK1 are for the transmission of such clock signals as shown in FIG. 8 to each shift register 18.

Lines TM and OS which are shown in FIG. 7 are control lines for controlling the operation of the shift register circuit portion 17. To the line TM is transmitted a signal for changing the operation mode of the shift register circuit portion 17 into a test mode, while to the line OS is transmitted a signal for setting detection data provided from the intra-cell circuit into the shift register circuit portion 17. Signal levels of the control lines during operation of the shift register circuit portion 17 are shown in FIG. 9.

The shift registers 18 illustrated in FIG. 7 are classified into input shift registers and output shift registers. FIG. 10 shows symbols of an input shift register 18a. Lines SI and SO are shift-in and shift-out lines, respectively, and correspond to the line D shown in FIG. 7. Line GO is connected to the intra-cell circuit. FIG. 11 illustrates an internal circuitry of the input shift register 18a. Lines CKl and CKO are connected to input terminals of ANDs 19a and 19b, respectively. Line OS is connected to the other input terminals of ANDs 19a and 19b. Outputs of ANDs 19a and 19b are connected to input terminals of ANDs 20a and 20b, respectively. Line SI is connected to a flip flop (hereinafter referred to simply as "F/F") through and 20a. Output of F/F 21a is connected to F/F 21b through AND 20b, while output of F/F 21b is connected to an input terminal of AND 22 and line $\overline{SO}$. Line TM is connected to input terminals of ANDs 22 and 23. Outputs of ANDs 22 and 23 are connected to line GO through OR 24. Thus, upon input of "L" signal to line OS, the ANDs 19a and 19b operate and clock signals are transmitted to ANDs 20a and 20b. Check data inputted from line SI is shifted-in to F/Fs 21a and 21b in synchronism with the clock signals. Upon input of "H" signal to line TM, the AND 22 operates and check data is inputted to the intra-cell circuit. On the other hand, upon input of "H" signal to line OS, the ANDs 19a and 19b cease to operate and check data is not shifted.

Referring now to FIG. 12, there are illustrated symbols of an output shift register 18b. Line GI is connected to the intra-cell circuit. FIG. 13 illustrates an internal circuit of the output shift register 18b. Line SI is connected to an input terminal of AND 25. Line OS is connected to input terminals of ANDs 25 and 26. Outputs of the ANDs 25 and 26 are connected to an input terminal of AND 28a through OR 27. To the other input terminal of AND 28a is connected line CK1. Output of AND 28a is connected to an input terminal of AND 28b through F/F 21a. To the other input terminal of AND 28b is connected line CKO, while output of AND 28b is connected to line $\overline{SO}$ through F/F 21b. Line GI, which is connected to the intra-cell circuit, is connected to an input terminal of AND 26 and also to a pad 14. Upon input of "L" signal to line OS, the AND 25 operates and check data inputted from line SI is shifted-in to F/Fs 21a and 21b in synchronism with clock signals. On the other hand, upon input of "H" signal to line OS, the AND 25 ceases to operate. Instead, AND 26 operates and detection data from the intra-cell circuit which has been transmitted to line GI is shifted-in to F/Fs 21a and 21b in synchronism with clock signals. At this state, if "L" signal is again inputted to line OS, detection data is outputted from the output shift register 18b to line $\overline{SO}$. When the signal levels of lines TM and OS are both "L", the shift register circuit portion 17 does not operate.

Thus, in this embodiment 1, check data which have been inputted in series through test pads 15 and line D can be converted to parallel signals through the shift register circuit portion 17 and the signals transmitted to the intra-cell circuit. Also, detection data which have been outputted in parallel from the intra-cell circuit can be converted to serial signals through the shift register circuit portion 17 and the signals taken out from the test pads 15. Therefore, the intra-cell circuit can be checked through a small number, say 5 to 11, of test pads 15.

The semiconductor integrated circuit device manufacturing method of this embodiment 1 will be described below with reference to FIGS. 1 to 25.

First, in the diffusion process 2 shown in FIG. 1, there are formed source and drain regions of semiconductor elements such as, for example, MOSFETS. Thereafter, in the primary wiring process 3, the semiconductor elements are interconnected to form the macrocells 11 in each chip region 10 on the wafer 9. In this embodiment 1, as described above, the macrocells 11 are arranged, for example in the form of a lattice, in the chip region 10. In this case, a principal portion of the wafer 9 is as illustrated as a sectional view in FIG. 14. Broken lines in the figure each indicate a boundary between adjacent macrocells 11. The intra-cell circuit and input-output circuits described above are formed by the intra-cell lines 30. Illustratively, the width and thickness of each intra-cell line 30 are about 2 $\mu m$ and 0.5 $\mu m$, respectively, and the line pitch is about 2.5 $\mu m$.

Subsequently, in the macrocell checking process 4, each macrocell 11 is checked for electrical characteristics by means of a wafer prober, for example. Check items include, for example, DC function test, DC parameter test for input-output terminals, and AC switching test. For example, as shown in FIG. 15, the check is performed by moving a probe card 31a to each macrocell 11. By utilizing the lattice-like arrangement of the macrocells 11 the plural macrocells 11 arranged in the row direction may be checked simultaneously by means of an elongated probe card 31b, as shown in FIG. 16. In this case, the inspection time can be made shorter than in the case of checking for each macrocell 11. Individually, FIGS. 17 and 18 illustrate the state of probes 32 in the macrocell checking process 4. First, the probes 32 are brought into abutment with the test pads 15. Then, check data are inputted to the intra-cell circuit from the test pads 15 through the shift register circuit portion 17 (see FIG. 7). Then, detection data outputted from the intra-cell circuit to the test pads 15 through the shift register circuit portion 17 on the basis of the check data are compared with an expected value. On the basis of that comparative information there is made judgment as to whether the macrocell 11 is good or bad. At this time there is prepared a quality information about the macrocell 11, in which there are described data such as position coordinates of good and bad macrocells. A defective macrocell 11a which was judged to be defective as a result of the inspection is shown by oblique lines in FIG. 19.

Next, in the defective macrocell replacing process 5, the defective macrocell 11a is removed from the main surface of the wafer 9 by an FIB (Focused Ion Beam) process for example, as shown in FIG. 20. In this process, for example, gallium (Ga) is used as a liquid metal ion source of the FIB, and acceleration energy is 30 KeV or so. The depth of the removed region is, illustratively, 20 $\mu m$. The defective macrocell 11a may be removed from the back of the wafer 9 or from both sides of the wafer. The defective macrocell 11a removing process is not limited to the FIB process. Various processing methods can be adopted where they permit quick removal of the defective macrocell 11a without damaging the other surrounding macrocells 11. For example, there may be used a chemical or mechanical process or a process utilizing ultrasonic waves. Further, any of these processing methods may be combined with the FIB process.

After the removal of the defective macrocell 11a, a good macrocell 11b for replacement is disposed in the removed region of the defective macrocell 11a, as shown in FIG. 21. The good macrocell 11b for replacement may be obtained from another wafer or from the same wafer 9. For example, the good macrocell 11b for replacement may be obtained from the same wafer 9 in the following manner. A macrocell region for replacement (not shown) for obtaining the good macrocell 11b is disposed beforehand in the vicinity of each chip region 10. For replacement of the defective macrocell 11a, a good macrocell 11b for replacement is obtained from the replacing macrocell region near the chip region 10 to which the defective macrocell 11a belongs. As a result, it becomes possible to approximate electrical characteristics of elements, etc. between the good macrocell 11b for replacement embedded in the defective macrocell 11a removed region and the other macrocells 11.

The good macrocell 11b for replacement is obtained from the wafer 9 by FIB processing, for example, and the thickness thereof is set to a predetermined value by back grinding or nay other suitable means. In this case, the thickness of the good macrocell 11b for replacement is made equal to the depth of the defective macrocell 11a removed region. As a result, when the good macrocell 11b for replacement is embedded in the defective macrocell removed region, the surface thereof becomes equal in height to the surfaces of the surrounding macrocells 11. Therefore, a difference in height does not occur at the boundary portion between the good macrocell 11b for replacement and the surrounding macrocells 11. Consequently, it is possible to prevent the breaking of the intercell lines 16 caused by such difference in height.

After the good macrocell 11b for replacement was disposed in the defective macrocell 11a removed region, the trenches between it and the surrounding macrocells 11 are filled up, for example by a photo CVD (chemical vapor deposition) method. Illustratively, for example, molybdenum carbonium is thermally decomposed with a laser beam at a low temperature of 150° C. or so to fill up the trench portions. Other materials, such as tungsten, can be deposited by, e.g., photo CVD, to fill up the trenches. In this case, the trench fill-up processing is automated by detecting an end point of the fill-up operation. This processing gives rise to a protuberant upper portion 33, which induces brreaking of the intercell lines 16. In this embodiment 1, after the trench fill-up processing, the protuberant upper portion 33 is scraped off by FIB processing, for example, while monitoring the operation to flatten that portion. The operation can be visually monitored to determine flatness. In this way it is made possible to arrange only good macrocells 11 in the chip region 10, and, hence, up to this stage it becomes possible to form only good chip regions 10 on the wafer 9.

Thereafter, in the secondary wiring process 6, the macrocells 11 are interconnected by the intercell lines 16, and a predetermined LSI is formed in each chip region 10. In this connection, a principal portion of the wafer is shown in a sectional view in FIG. 23. As to the size of each intercell line 16, the width and thickness are, illustratively, about 4 μm and 1 μm, respectively, and the line pitch is about 5 μm. In this embodiment 1, the size (e.g., cross-sectional area) of each intercell line 16 is set larger than that of each intra-cell line 30. This is for the following two reasons. The first reason is that the wiring resistance of each intercell line 16 is to be reduced. Since the intercell line 16 connects between macrocells 11, its length is larger than that of each intracell line 30. However, with increase of the wiring length, the wiring resistance increases as well. In view of this point, the size of the intercell line 16 is set larger than that of the intra-cell line 30 to reduce the wiring resistance. The second reason is that a defective wiring after the end of the second wiring process is to be reduced. More particularly, the occurrence of defects in wiring in the secondary wiring process 6 is to be decreased by mitigating the dust particle sensitivity of the intercell line 16. By so doing it becomes possible to suppress the decrease of the chip yield caused by defective wiring after the defective macrocell replacing process 6.

Since the good macrocell 11b for replacement was later embedded in the wafer 9, there is a slight displacement in position, and this positional displacement sometimes makes it impossible to connect the good macrocell 11b for replacement with the other macrocells 11 in the chip region 10. To avoid this, the following data processing is performed in this embodiment 1 before transferring a wiring pattern onto photoresist, using a direct electron beam writing device, for example. First, there is prepared a position data of the good macrocell 11b for replacement embedded in the defective macrocell 11a removed region. Then, on the basis of such position data there is prepared a dislocation correcting data, and the wiring pattern data in the direct electron beam writing device is modified. According to another method which may be adopted for preventing a defective connection of the intercell lines 16, a planar size of each pad 14 is set a little larger from the beginning, taking a possible dislocation into account.

Subsequently, in the wafer test process 7, the logical LSI in each chip region 10 is checked for electrical characteristics, and the quality of each chip region 10 is determined. Thereafter, good chip regions 10 are divided from the wafer through the wafer scribing process 8 to complete the chip fabrication.

Thus, according to this embodiment 1 it is possible to obtain the following effects.

(1) In the early stage of the wafer process, namely, in a stage where a high percentage of the occurrence of defects due to fineness and high integration density occur, it is possible to remove only a defective portion in each chip region 10 and remedy that portion easily. Consequently, the following can be done. First, macrocells 11 of high integration density and high performance are formed in each chip region 10 using an up-to-date processing technique. Then, the macrocells 11 are checked and a defective macrocell 11a is removed. Subsequently, a good macrocell 11b fabricated by an up-to-date processing technique is disposed in the chip region 10 in place of the defective macrocell 11a. Thus, up to this sate, it is possible to constitute the chip region 10 using macrocells 11 of high integration density and high performance fabricated by up-to-date processing techniques. Thereafter, the macrocells 11 are interconnected to form a logical LSI in the chip region 10. Consequently, it is possible to effect a redundancy operation with certainty and improve the chip yield without degrading the performance of the logical LSI produced.

(2) As a result of the above (1), it becomes possible to suppress the lowering of chip yield caused by the increase in chip size and integration density of the semiconductor integrated circuit device. Consequently, it is possible to cope with the increase in capacity and upgrading of performance of the semiconductor integrated circuit device. So, it becomes possible to promote the attainment of a single chip computer system.

(3) Since correction of defects is performed in a stage prior to formation of the logical LSI in each chip region 10, namely, in the stage before the entire chip comes to have a predetermined function as a semiconductor integrated circuit, and just after detection of the defect, it is possible to realize a redundancy technique of high applicability and certainty.

(4) As a result of the above (3), it becomes possible to cope with the customization of a semiconductor integrated circuit.

(5) As a result of the above (2) and (3), even in a low yield stage at the beginning of development of the logical LSI, it is possible to promote checking the logic.

(6) Since the macrocells 11 and test pads 15 are arranged regularly, it is possible to check all the macrocells 11 in each chip region 10 in a short time. Particularly, by arranging the macrocells 11 in a lattice form and checking plural macrocells 11 positioned on the same straight line simultaneously in the macrocell checking process 4, it is made possible to check all the macrocells 11 in the chip region in a still shorter time.

(7) Check data which have been inputted through the test pads 15 are converted to parallel signals through the shift register circuit portion 17 and the signals inputted to the intra-cell circuit, then detection data which are outputted in parallel from the intra-cell circuit on the basis of the check data are converted to serial signals through the shift register circuit portion 17 and the signals outputted to the test pads 15, whereby it is possible to decrease the number of test pads 15 to a large extent. Consequently, it becomes possible to set the size of each test pad 15 to a size necessary for a probe check. As a result, it becomes possible to check electrical characteristics of fine macrocells 11 of high integration density.

(8) By obtaining a good macrocell 11b for replacement from the wafer 9 from which the defective macrocell 11a has been removed, it is made possible to approximate electrical characteristics of elements, etc. between the good macrocell 11b for replacement and the other macrocells 11 in the chip region 10.

(9) Since the surface of the good macrocell 11b for replacement and the surfaces of the surrounding macrocells 11 are set at the same height, there is formed no difference in height between those macrocells 11 and 11b. Consequently, it is possible to prevent breaking, etc. of the intercell lines 16 caused by such difference in height.

(10) Since the space between the good macrocell 11b for replacement and the surrounding macrocells 11 is filled with molybdenum (formed, e.g., by CVD of molybdenum from molybdenum carbonyl), for example, to fix the good macrocell 11b and thereafter the resulting protuberant upper portions 33 are flattened, there is formed no difference in height caused by the upper portions 33. Consequently, it becomes possible to prevent breaking, etc. of the intercell lines 16 caused by the difference in height.

(11) By setting the sectional area of the intercell lines 16 larger than that of the intra-cell lines 30, it is possible to suppress increase in resistance of the intercell lines 16, which are relatively long. That is, it becomes possible to suppress a wiring delay, etc. Besides, since the dust particle sensitivity of the intercell lines 16 is mitigated, it is possible to diminish occurrence of defects of the intercell lines 16.

(12) As a result of the above (9) to (11), it becomes possible to diminish wiring defects after the defective macrocell replacing process 5. In other words, it is possible to suppress the decrease of chip yield caused by wiring defects after the defective macrocell replacing step 5. For example, yields of 98-99% can be achieved.

(13) As a result of the above (2) and (12), it becomes possible to reduce the product cost.

Embodiment 2

Figure 24:
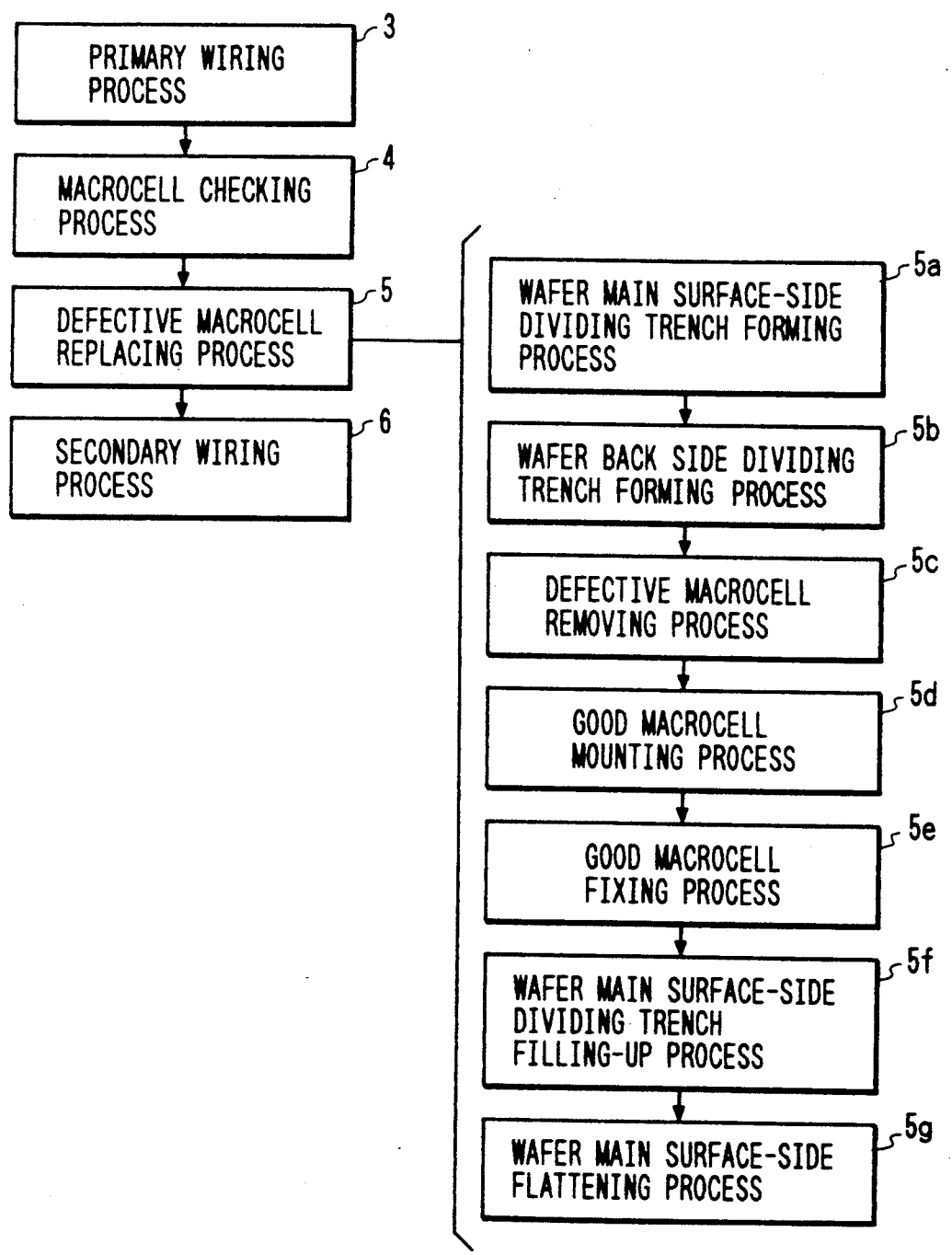
FIG. 24 is a process chart showing a method for manufacturing a semiconductor integrated circuit device according to another embodiment of the present invention.
Figure 25:
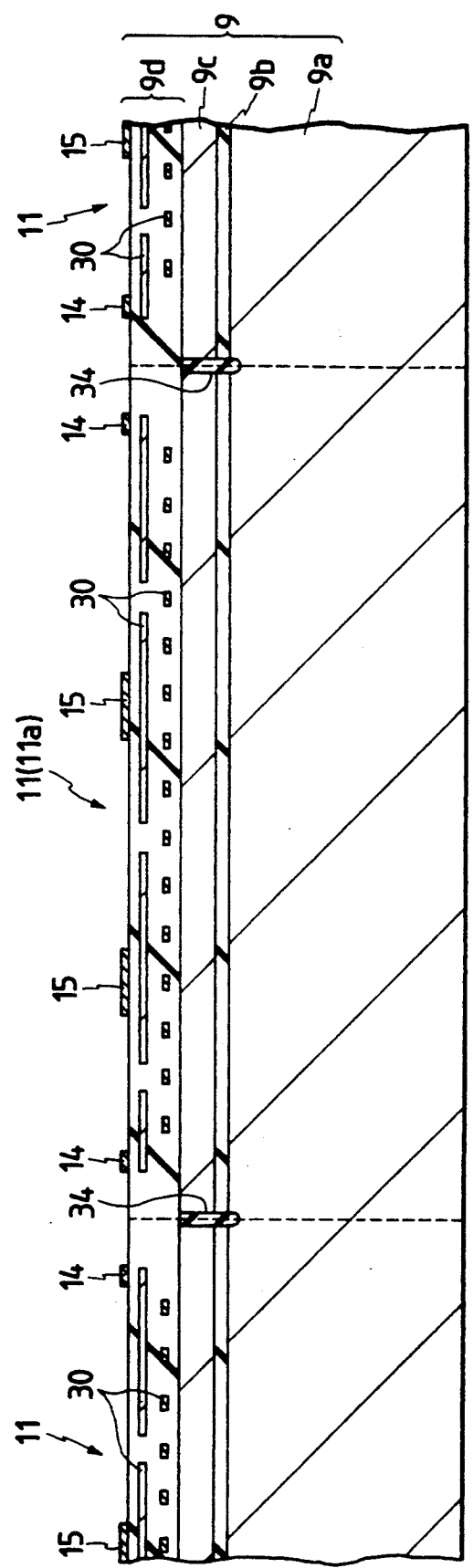
FIG. 25 is a sectional view of a principal portion of a wafer just after the end of a primary wiring process.
Figure 26:
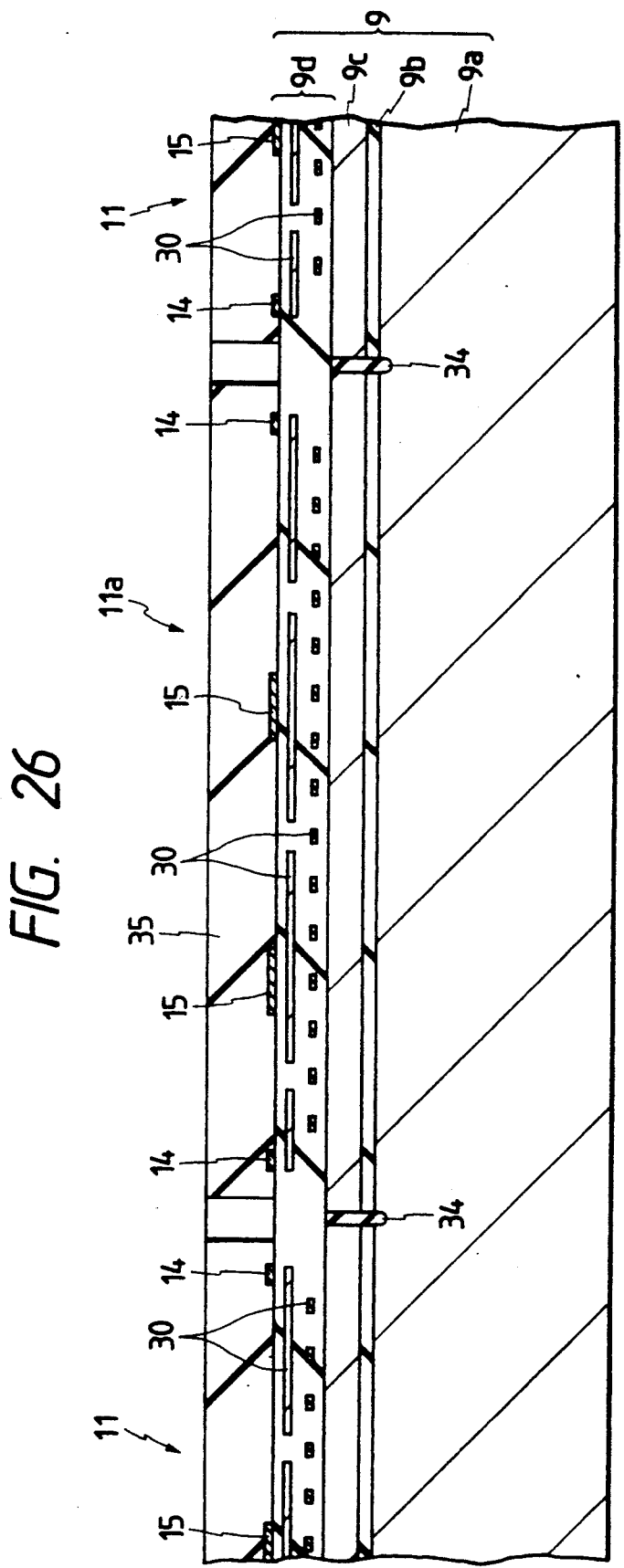
FIGS. 26 and 27 are each a sectional view of the principal portion of the wafer for explaining a wafer main surface-side dividing trench forming process.
Figure 27:
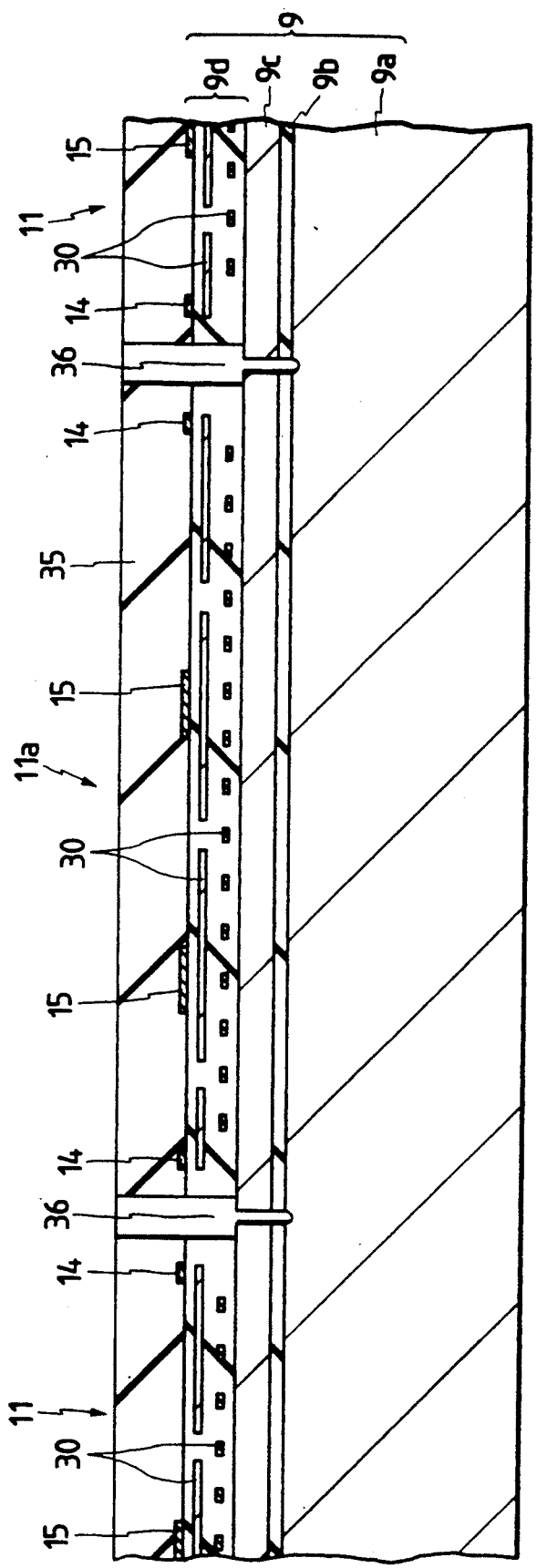
Figure 28:
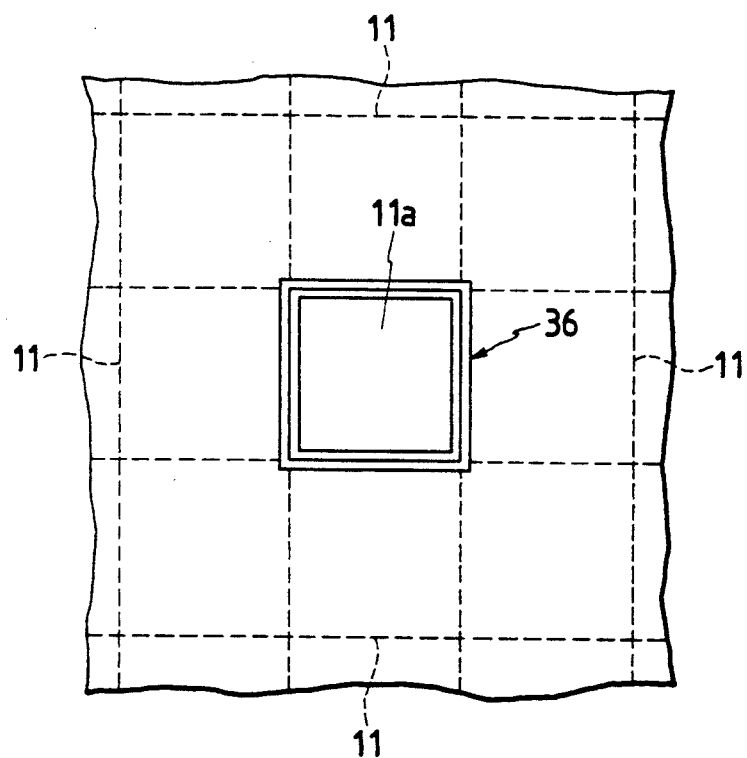
FIG. 28 is a plan view of a principal portion of the wafer illustrated in FIG. 27.
Figure 29:
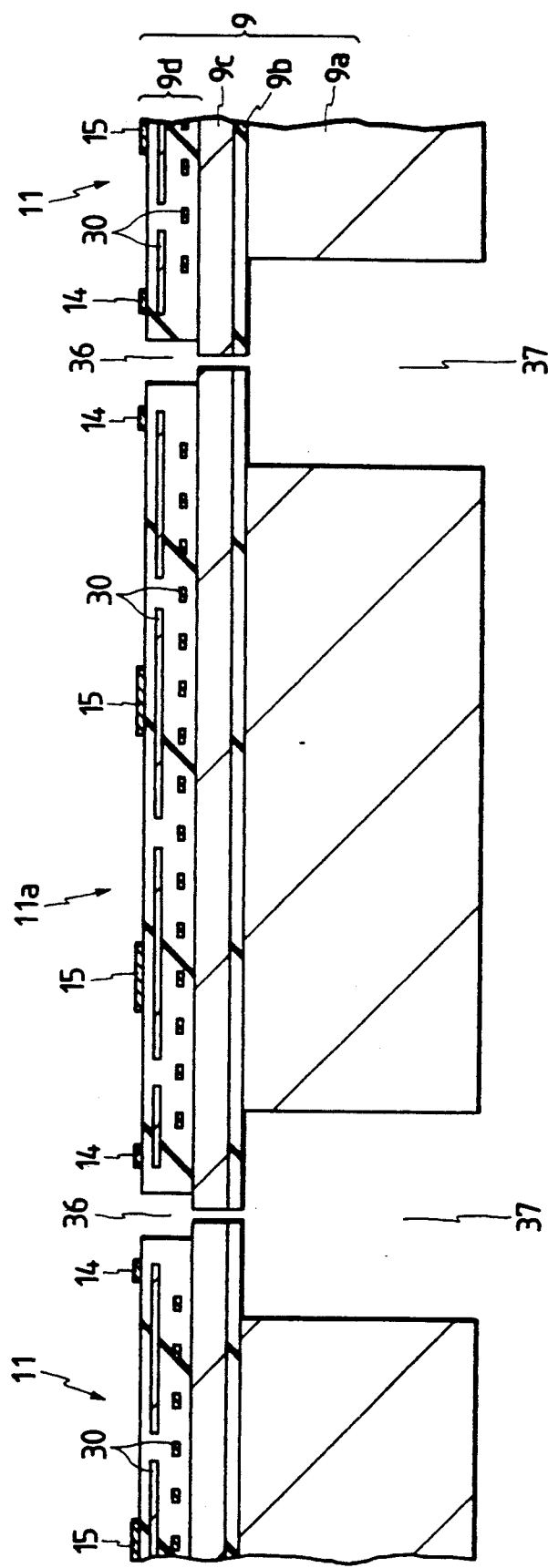
FIG. 29 is a sectional view of a principal portion of the wafer for explaining a wafer back-side dividing trench forming process.
Figure 30:
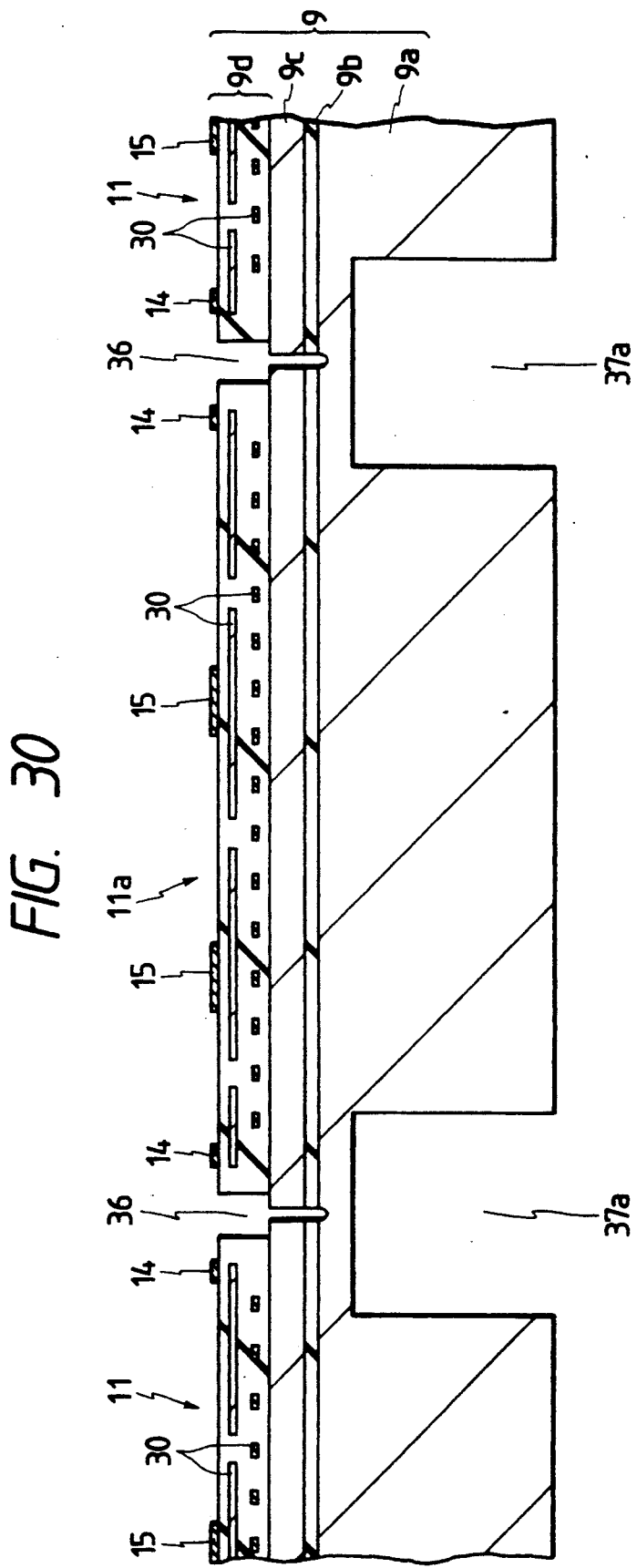
FIG. 30 is a sectional view of the principal portion of the wafer for explaining a modification of the wafer back-side dividing trench forming process.
Figure 31:
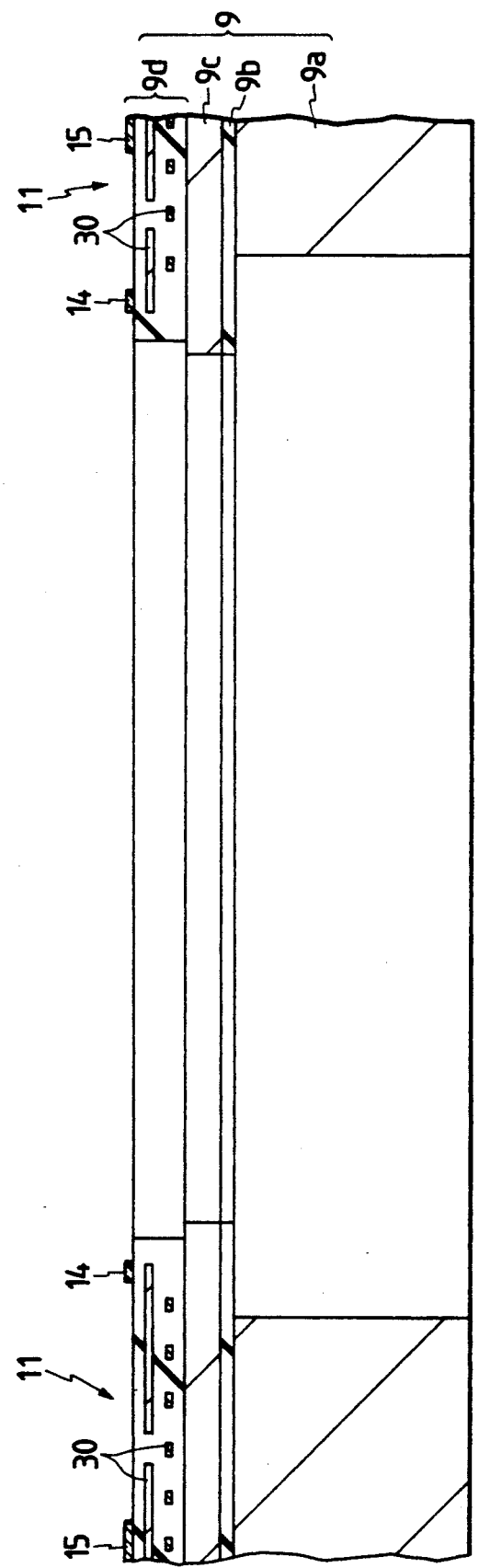
FIG. 31 is a sectional view of the principal portion of the wafer just after the end of a defective macrocell removing process.
Figure 32:
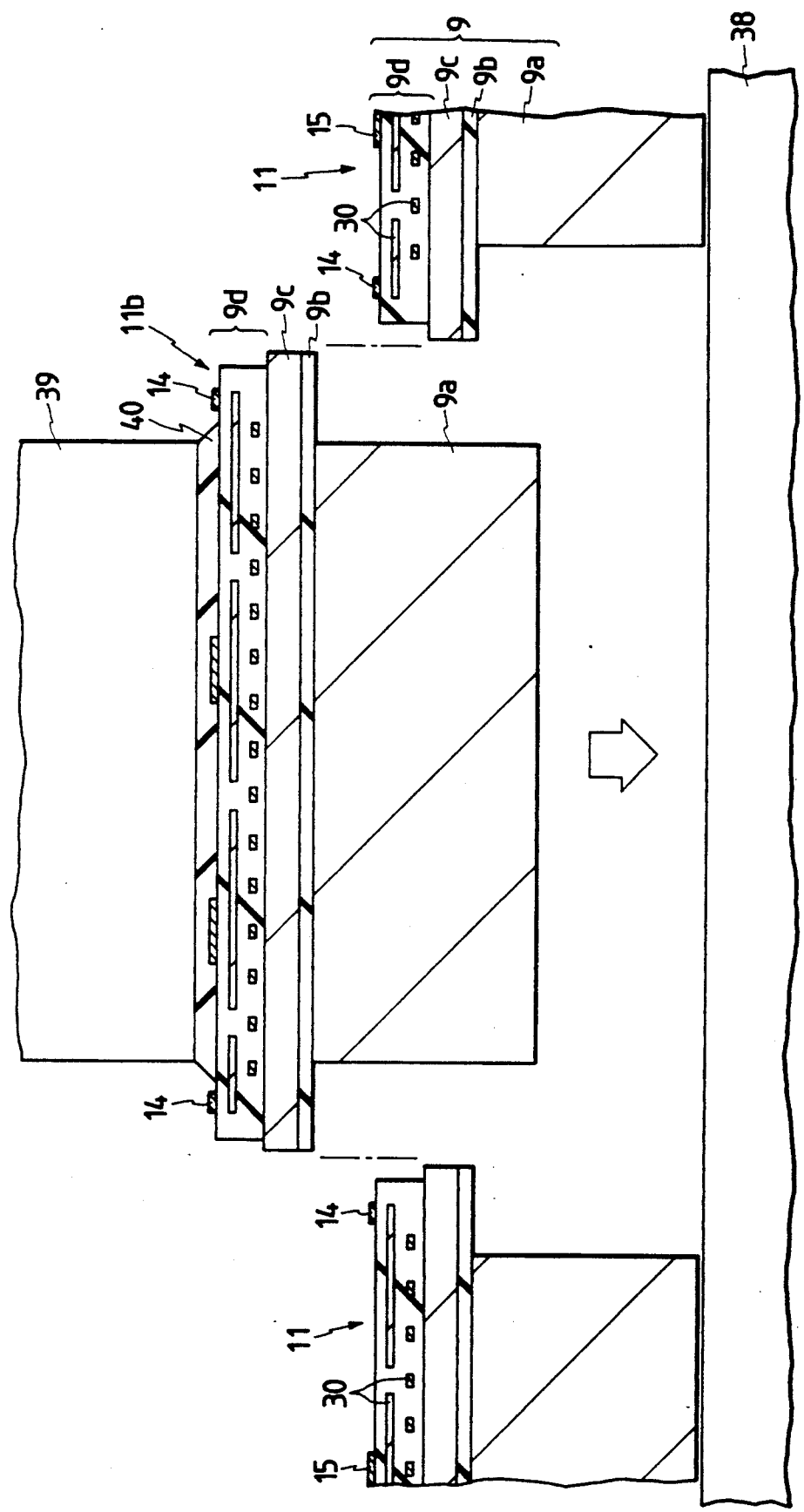
FIG. 32 is a sectional view of the principal portion of the wafer explanatory of a process for mounting a good macrocell for replacement.
Figure 33:
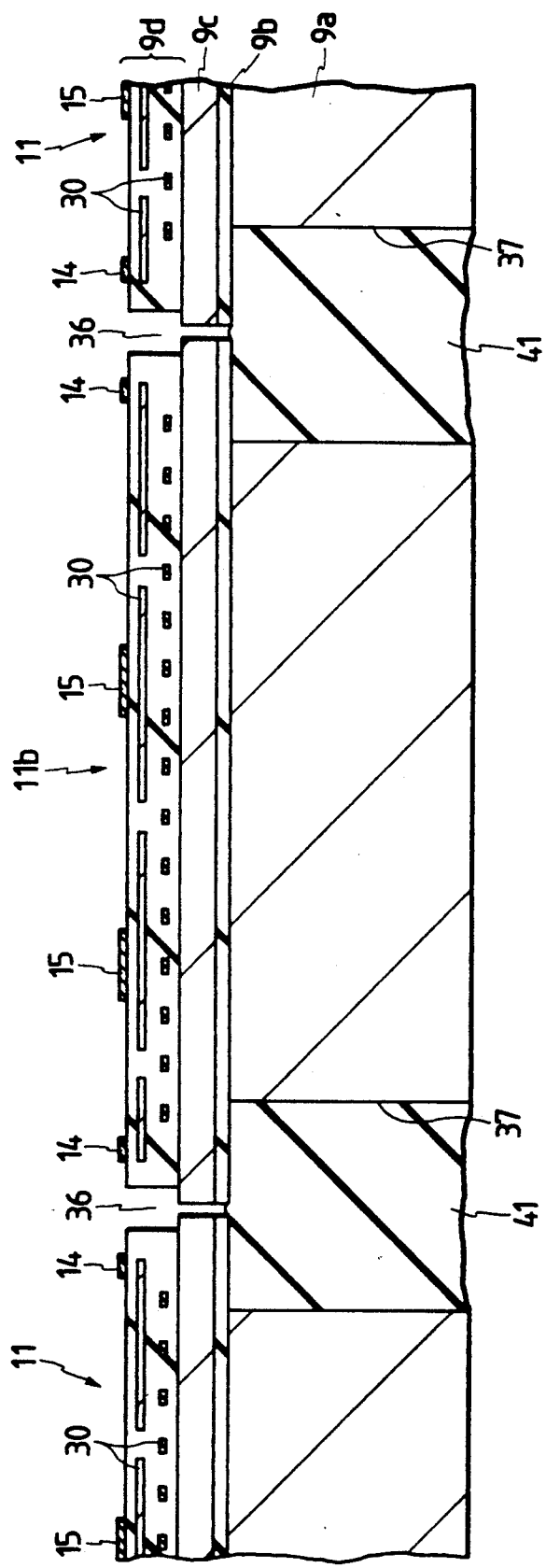
FIG. 33 is a sectional view of the principal portion of the wafer for explaining a good macrocell fixing process.
Figure 34:
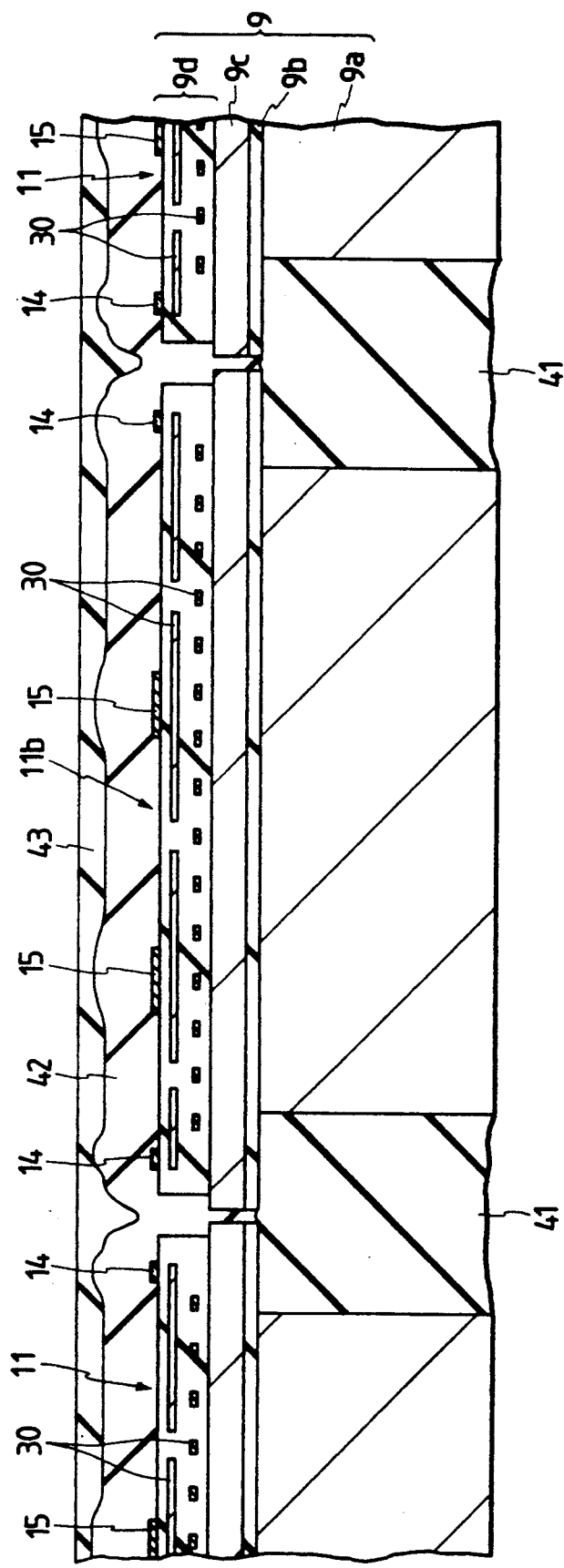
FIG. 34 is a sectional view of the principal portion of the wafer explanatory of a process for filling up a wafer main surface-side trench.
Figure 35:
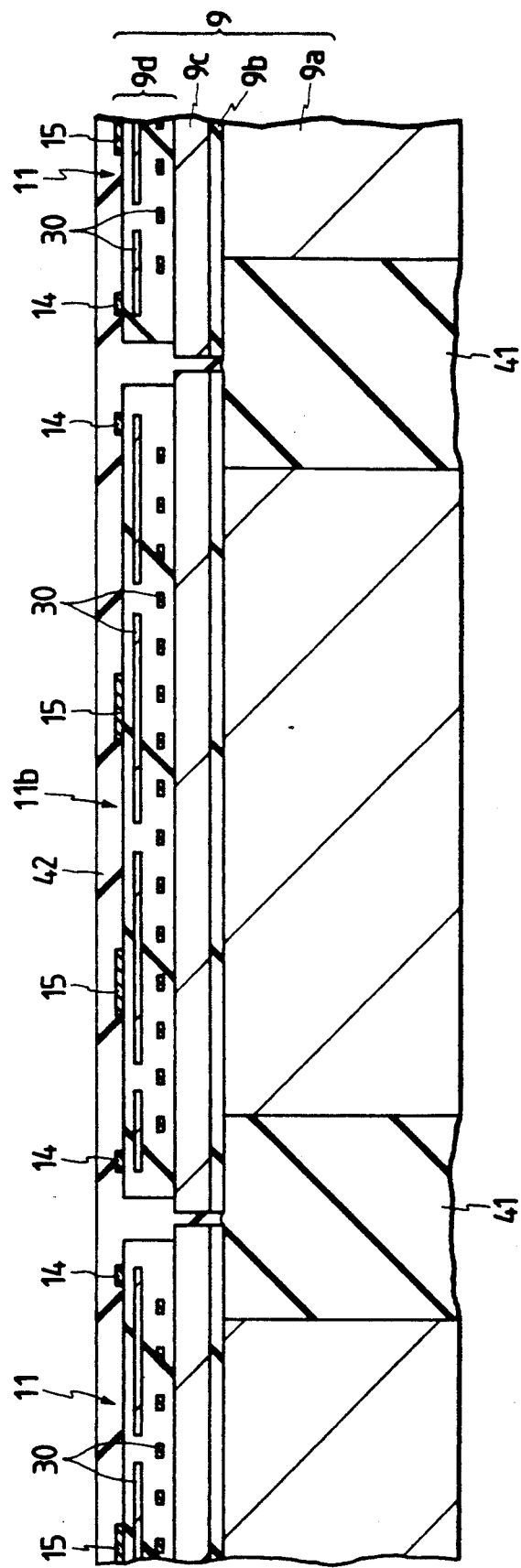
FIG. 35 is a sectional view of the principal portion of the wafer just after the end of a wafer main surface side flattening process.

FIG. 24 is a process chart showing a method for manufacturing a semiconductor integrated circuit device according to another embodiment of the present invention; FIG. 25 is a sectional view of a principal portion of a wafer just after the end of a primary wiring process; FIGS. 26 and 27 are each a sectional view of the principal portion of the wafer for explaining a wafer main surface-side dividing trench forming process; FIG. 28 is a plan view of a principal portion of the wafer illustrated in FIG. 27; FIG. 29 is a sectional view of a principal portion of the wafer for explaining a wafer back-side dividing trench forming process; FIG. 30 is a sectional view of the principal portion of the wafer for explaining a modification of the wafer back-side dividing trench forming process; FIG. 31 is a sectional view of the principal portion of the wafer just after the end of a defective macrocell removing process; FIG. 32 is a sectional view of the principal portion of the wafer explanatory of a process for mounting a good macrocell for replacement; FIG. 33 is a sectional view of the principal portion of the wafer for explaining a good macrocell fixing process; FIG. 34 is a sectional view of the principal portion of the wafer explanatory of a process for filling up a wafer main surface-side trench; and FIG. 35 is a sectional view of the principal portion of the wafer just after the end of a wafer main surface-side flattening process.

The semiconductor integrated circuit device manufacturing process of this embodiment 2 is illustrated in FIG. 24. The other processes than the defective macrocell replacing process 5 are the same as in the previous embodiment 1. For example, the defective macrocell replacing process 5 in this embodiment 2 comprises seven processing steps 5a to 5g.

The semiconductor integrated circuit device manufacturing method of this embodiment 2 will be described below in accordance with the process chart of FIG. 24 and with reference to FIGS. 25 to 35.

A principal portion of a wafer 9 just after the end of the primary wiring process 3 is illustrated in a sectional view in FIG. 25. For example, the wafer 9 used in this embodiment 2 is of an SOI (Silicon On Insulator) structure, and a semiconductor layer 9a is formed of single crystal silicon. On the semiconductor layer 9a is formed an insulating layer (an intra-wafer insulating layer) 9b. For example, the insulating layer 9b is formed of $SiO_2$ and has a thickness of 0.5 μm or so. Further, a semiconductor layer 9c is formed on the insulating layer 9b. For example, the semiconductor layer 9c is formed by epitaxial growth using a single crystal silicon. The semiconductor layer 9c has a thickness of, say, 2 to 3 μm and has semiconductor integrated circuit elements formed thereon (e.g., the elements having semiconductor regions formed in semiconductor layer 9c). Further, an insulator (a main surface-side dividing trench forming member) 34 for element isolation between macrocells is formed on the semiconductor layer 9c along the outer periphery of each macrocell 11. For example, the insulator 34 is formed of $SiO_2$. The width of the insulator 34 is, say, 0.5 μm or so and the depth thereof reaches a position slightly deeper than the insulating layer 9b. Illustratively, the insulator 34 can be formed by chemical vapor deposition (CVD) of TEOS (tetra ethyl orthosilicate). In this process, which is a low temperature CVD process, the tetra ethyl orthosilicate is decomposed to form $SiO_2$. Further formed on the semiconductor layer 9c is a multi-layer wiring 9d, including intracell lines 30 formed therein. For example, the thickness of the multilayer wiring 9d is 3 to 5 μm and that of the wafer 9 including the multilayer wiring 9d is 500 μm. The broken lines in FIG. 25 each indicate a boundary between adjacent macrocells 11.

In the macrocell checking process 4 for the wafer 4, like the previous embodiment 1, probes 32 (see FIG. 18) are brought into abutment with the test pads 15 in each macrocell 11 to determine whether the macrocell is good or defective. At this time, for example, position data of a defective macrocell 11a is transmitted into a pattern data storing region of a direct electron beam writing device (not shown).

Next, in the defective macrocell replacing process 5, the defective macrocell 11a is replaced with a good macrocell for replacement in accordance with the processes 5a to 5f shown in FIG. 24.

In the process 5a, which is a main surface-side dividing trench forming process, first, as shown in FIG. 26, a resist 35 for direct electron beam writing is applied onto the multilayer wiring 9d and thereafter the resist 35 is subjected to patterning according to a direct electron beam writing method. In this case, patterning data is prepared automatically in accordance with the position data of the defective macrocell 11a. More specifically, only the resist portion positioned in the outer periphery of the defective macrocell 11a is removed. Illustratively, the width of the resist removed region is, say, 2 to 3 μm.

Subsequently, as shown in FIG. 27, a main surface-side U trench (a main surface-side dividing trench) 36 is formed using the resist 35 as a mask. For example, the main surface-side U trench 36 is formed by etching off the multilayer wiring 9d portion and the insulator 34 portion for inter-macrocell element isolation both located under a resist removed region, for example by an RIE method under conditions set so as to etch only $SiO_2$ selectively. The wafer 9 after this processing is as illustrated in plan view in FIG. 28. As shown in FIG. 28, the main surface-side U trench 36 is formed only in the outer periphery of the defective macrocell 11a, with the processing accuracy of the lithography technique. Therefore, planar and sectional shapes and sizes of the main surface-side U trench 36 and the size of the defective macrocell 11a removed region can be finished with an extremely high accuracy (±0.1 μm). And those shapes and sizes can be reproduced in a satisfactory state. Consequently, the positioning and mounting of a good macrocell for replacement, which will be described later, can be done always in a satisfactory manner.

Desirably, the main surface-side dividing trench is provided such that the replacing macrocell has a gap between it and the surrounding macrocell regions of at most 1 μm. That is, the total of the gaps at opposed sides of the replacing macrocells should be at most 1 μm. By having such a maximum gap of 1 μm, it becomes easier to fill the main surface-side dividing trench and to flatten the upper surface of the filling material (that is, to provide the upper surface of the filling material in substantially the same plane as the upper surfaces of the replacing macrocells and the surrounding macrocells). Moreover, stresses on intercell wiring can be reduced.

Next, in the process 5b, which is a wafer back-side dividing trench forming process, there is formed a back side U trench (a back side dividing trench) 37 extending from the back side of the wafer 9 up to the main surface-side U trench 36, as shown in FIG. 29, for example by an RIE method under conditions set so as to etch only Si selectively, using a resist (not shown) as a mask. Since the insulating layer 9b which constitutes the wafer 9 is formed by $SiO_2$ for example, it serves as an etching stopper layer at the time of forming the back side U trench 37. Therefore, during formation of the back side U trench 37 there is no fear of deformation in sectional shape of the main surface-side U trench 36 or change in size of the main surface-side U trench or of the defective macrocell removed region. So the predominance in positioning and mounting of the good macrocell for replacement is not affected. Besides, at the time of forming the back side U trench 37, it is not likely at all that the semiconductor integrated circuit elements of the macrocells 11 and defective macrocell 11a will be damaged by the insulating layer 9a. Thus, this macrocell taking-out method can be used as a good macrocell producing method. The reason for forming the trench 37 from the back side of the wafer 9 is that since a lower processing accuracy (±5 μm) suffices on the back side of the wafer 9 than the wafer main surface side, there is room for selection of the trench processing method as will be described later, and hence it is possible to shorten the trench processing time. The method forming the back side U trench 37 is not limited to such a dry etching method as RIE, but various changes may be made. For example, the U trench 37 may be formed in the following manner. First, as shown in FIG. 30, a U trench 37a is formed up to an intermediate position of the semiconductor layer 9a, for example up to a position of 450 μm or so in depth from the back of the wafer 9, by means of dicing blade. Thereafter, the remaining portion of the semiconductor layer 9a in the trench depth direction is removed by etching according to, for example an RIE method under conditions set so as to etch only Si selectively, to obtain the back side U trench 37 shown in FIG. 29. In this case, the time required for forming the back side U trench 37 can be shortened. In the case where the U trench 37a shown in FIG. 30 is formed by a wet etching method, the remaining portion may be moved by a dry etching method. As other methods for forming the back side U trench 37 there may be used an ultrasonic processing method and a laser processing method.

Then, in the process 5c, which is a defective macrocell removing process, the defective macrocell 11a divided from the wafer 9 is removed. A principal portion of the wafer just after the end of the process 5c is illustrated as a sectional view in FIG. 31.

In the next process 5d, which is a good macrocell mounting process, a good macrocell 11b for replacement is disposed in the defective macrocell removed region, as shown in FIG. 32. The good macrocell 11b is taken out from another wafer of SOI structure in the same way as in the foregoing method for taking out the defective macrocell 11a. For example, the good macrocell 11b is disposed in the defective macrocell removed region in the following manner. First, the wafer 9 after removal of the defective macrocell 11a is put on an XYθ stage 38. Then, an underside of a stick 39 and the main surface of the good macrocell 11b are temporarily bonded together using a predetermined adhesive 40, and in this state the good macrocell 11b is moved to a position just above the defective macrocell removed region of the wafer 9.For holding the good macrocell 11b there may be used a vacuum pad, for example. Thereafter, alignment is made and the good macrocell 11b is moved downward in FIG. 32 into the defective macrocell removed region.

In the process 5e, which is a good macrocell fixing process, the back side U trench 37 is filled with a resin 41, such as a polyimide resin, for example, to fix the good macrocell 11b, as shown in FIG. 33. The resin 41 is not limited to a polyimide resin. Preferred examples of the resin 41 include materials having such properties as being close to Si in thermal expansion coefficient, easy to be filled into the back side U trench and high in heat conductivity.

Illustratively, where the device is to be subjected to high temperatures after the back side U trench 37 is filled, the resin used to fill the trench is preferably PIQ resin ("polyimide isoindroquinazolinedione"). An epoxy resin can be used to fill back side U trench 37, when the device will not be subjected to high temperatures after filling the back side U trench 37.

Next, in the process 5f, which is a main surface-side dividing trench filling-up process, an insulating film 42 formed of SiO$_2$, for example, is deposited on the main surface of the wafer 9 by a CVD method or any other suitable method to fill up the main surface-side U trench 36, as shown in FIG. 34.

Subsequently, in the process 5g, which is a wafer main surface side flattening process, there is conducted the following processing. First, as shown in FIG. 34, a flattening insulating film 43 is deposited on the insulating film 42 to the extent that the upper surface of the film 43 is substantially flat. Thereafter, the flattening insulating film 43 is etched back by an RIE method for example to flatten the upper surface of the insulating film 42, as shown in FIG. 35.

Thereafter, the processing shifts to the secondary wiring process 6. This process and the subsequent processes are the same as in the previous embodiment 1.

According to the embodiment 2 it is possible to obtain the following effects.

(1) Since the main surface-side U trench 36 is formed with the accuracy (±0.1 μm) of the photolithography technique, the size of the defective macrocell 11a removed region and that of the good macrocell 11b for replacement can be made extremely high in accuracy and can be reproduced in a satisfactory state. Further, since the insulating layer 9b serves as an etching stopper layer while the back side U trench 37 is formed by etching, the dimensional accuracy in the processing of the main surface-side U trench is not deteriorated. Consequently, when the good macrocell 11b is disposed in the defective macrocell removed region, its positioning and mounting can be done in an extremely satisfactory manner.

(2) As a result of the above (1), the good macrocell 11b thus mounted and the surrounding macrocells 11 can be held in a state of extremely high flatness (that is, can have their upper surfaces in substantially a single plane).

(3) As a result of the above (1) and (2) it is possible to provide a good macrocell mounting technique of high reliability.

(4) For removing the defective macrocell 11b, it is sufficient to form a trench only in the outer periphery of the defective macrocell 11b, so the processing region for removing the defective macrocell can be greatly reduced in comparison with that in the previous embodiment 1. Consequently, the time required for removing the defective macrocell 11a can be made much shorter than in the embodiment 1.

(5) Since the processing accuracy for the back side U trench 37 may be lower (±5 μm) than that on the main surface side, a rougher processing than on the main surface side can be done, and thus there is room for selection of the processing method. Consequently, by forming the trench from the back side and by selecting an appropriate processing method it is possible to greatly shorten the trench processing time.

(6) Since the macrocells 11 can be taken out from the wafer 9 without damaging the interiors thereof, it is possible to produce good macrocells 11b in the same manner as in the removal of a defective macrocell 11a. In other words, it becomes possible to make the defective macrocell 11a removing process and the good macrocell 11b producing process common to each other.

(7) As a result of the above (4) to (6) it is possible to attain a high throughput.

Although the present invention has been described above concretely on the basis of embodiments thereof, it goes without saying that the invention is not limited to the above embodiments 1 and 2, and that various changes may be made while not departing from the gist of the invention.

Figure 36:
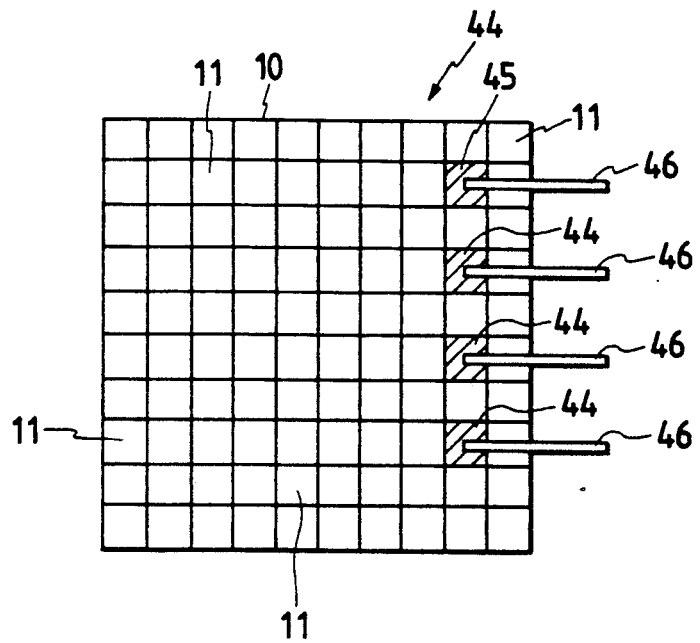
FIG. 36 is a plan view of a chip region fabricated by a semiconductor integrated circuit device manufacturing method according to a further embodiment of the present invention.
Figure 37:
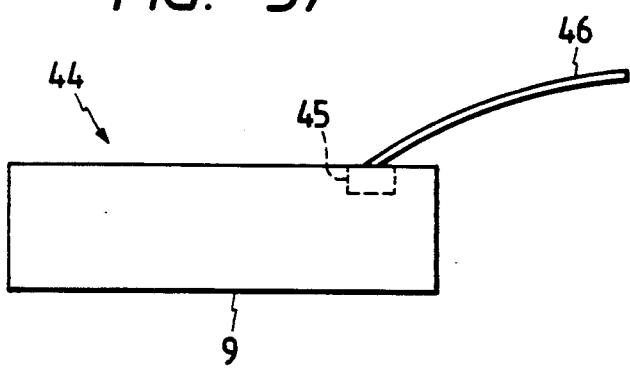
FIG. 37 is a side view of the chip region illustrated in FIG. 36.

For example, although in the above embodiments 1 and 2, defective macrocell was removed and a good macrocell for replacement disposed in the related chip region, this does not constitute any limitation. A different kind of a macrocell may be disposed in the chip region. By using a macrocell having a different circuit function it is made possible to change the logical function or expand the circuit function. For example, as shown in FIGS. 36 and 37, OEIC (Optical Electronics Integrated Circuit) cells 45 can be embedded in a chip 44 such as a RISC (Reduced Instruction Set Computer) processor comprising CMOS circuits. The OEIC cells 45 may each be disposed in a defective macrocell removed region or in another region. In this case, by using an optical fiber 46 in the signal transmission path between the chip 44 and a main memory or external memory, it becomes possible to effect an ultra-high speed data transfer between them. Consequently, by using the chip 44 as a work station, it becomes possible to improve the performance of the work station to a remarkable extent. That is, it is possible to create a new product value.

Although in the above embodiments 1 and 2, a wafer prober was used in the macrocell checking process, this does not constitute any limitation. For example, an EB tester may be used.

Although in the above embodiments 1 and 2, an explanation was made about the case of removing a macrocell judged to be defective in the macrocell checking process, this does not constitute any limitation. For example, this may be substituted by the following.

Spare macrocells are disposed beforehand in each chip region, for example in a dispensed form. Then, in the same manner as in the previous embodiments, a macrocell quality information is prepared in the macrocell checking process. Thereafter, in the secondary wiring process, wiring is not performed for a defective macrocell on the basis of the macrocell quality information. Then, the defective macrocell is replaced by a good macrocell out of the spare macrocells. In this way there is formed a predetermined semiconductor integrated circuit in the chip region.

Further, the following may be adopted. In the case where a defect such as breaking or short-circuit is found out in the intra-cell wiring as a result of checking the same wiring in each macrocell in the chip region, the defect is corrected by FIB processing for example. Subsequently, there is prepared a macrocell quality information in the chip region. Then, in the secondary wiring process, good macrocells are interconnected by wiring on the basis of that quality information to form a predetermined semiconductor integrated circuit. In all of these methods, since a defect is removed in an early stage of the wafer process, it is possible to realize a redundancy technique of high certainty and applicability. Besides, since the defective macrocell removing process and the good replacing macrocell embedding process are not performed, the number of processing steps can be decreased accordingly.

The present invention is not limited to LSI. For example, GaAs devices can be treated according to the present invention.

Although in the above embodiment 2 an explanation was made about the case of forming a dividing trench first from the wafer main surface side, no limitation is placed thereon. For example, a dividing trench extending up to an insulting layer of an SOI wafer may be formed first from the back side of the wafer. Also in this case, it is preferable that the insulating layer of the SOI wafer be used as an etching stopper layer.

Effects obtained by typical aspects of the present invention out of those disclosed herein will be described below briefly.

(1) According to the first aspect of the present invention, a defective portion in each chip region can be removed and corrected easily in an initial stage of the wafer process, namely, in a stage of where a high percentage of defects due to fineness and high integration density occurs. Consequently, the following can be done for example. First, macrocells are formed in each chip region by an up-to-date processing technique up to the primary wiring process. Then, in the event of occurrence of a defective macrocell, the defective macrocell is removed. Subsequently, a good macrocell produced by an up-to-date processing technique is disposed in the defective macrocell removed region. By so doing it is possible to ensure a redundancy operation and improve the chip yield without degrading the performance of the semiconductor integrated circuit. Consequently, it is possible to suppress the lowering of the chip yield caused by the increase in size and integration density of the semiconductor integrated circuit device, and cope with the increase in capacity and upgrading of performance of the semiconductor integrated circuit device. For example, therefore, it becomes possible to promote the realization of a single chip computer system. Further, since the correction of defect is performed before a predetermined semiconductor integrated circuit is formed in each chip region, that is, before the whole of the chip region comes to have the function of the predetermined semiconductor integrated circuit, and just after the detection of a defect, it is possible to realize a redundancy technique of high applicability and certainty. As a result, it becomes possible to cope with customization of the semiconductor integrated circuit device.

(2) According to the second aspect of the present invention, by checking plural macrocells at a time it is possible to complete the inspection of all the macrocells in each chip region in a short time.

(3) According to the third aspect of the present invention, by obtaining from the same wafer a good replacing macrocell to be embedded in the defective macrocell removed region, it is possible to approximate electrical characteristics of elements, etc. between the good macrocell for replacement and the other macrocells in the chip region.

(4) According to the fourth aspect of the present invention, since the surface of the good replacing macrocell embedded in the defective macrocell removed region is set at the same height as the surfaces of the surrounding macrocells, there does not occur any difference in height between those surfaces when the good macrocell is embedded in the defective macrocell removed region. Consequently, it is possible to prevent breaking, etc. of the intercell lines caused by the difference in height, and hence it is possible to diminish defective wiring in the secondary wiring process and suppress the lowering of chip yield caused by defective wiring after the defective macrocell replacing process.

(5) According to the fifth aspect of the present invention, since the upper portion of the material buried in the trench between the good replacing macrocell embedded in the defective macrocell removed region and the surrounding macrocells is flattened (removed), so that the surface of the material buried in the trench is at the same height as surfaces of the good replacing macrocell embedded in the defective macrocell removed region and of the surrounding macrocells, a difference in height caused by the buried material does not occur between the embedded good macrocell and the surrounding macrocells. Consequently, it is possible to prevent breaking, etc. of the intercell lines caused by the difference in height, and hence it becomes possible to diminish defective wiring in the secondary wiring process and suppress the lowering of chip yield caused by defective wiring after the defective macrocell replacing process.

(6) According to the sixth aspect of the present invention, since the sectional area of the intercell lines is made larger than that of the intra-cell wiring, it is possible to suppress the increase in resistance of the intercell lines, which are relatively long. That is, it is possible to suppress a wiring delay, etc. Besides, since dust particle sensitivity of the intercell lines is mitigated, it is possible to diminish wiring defects in the secondary wiring process, and hence it is possible to suppress the lowering of chip yield caused by a wiring defect after the defective macrocell replacing process.

(7) As a result of the above (1) to (6), the chip yield can be greatly improved, and it is possible to reduce the cost of the semiconductor integrated circuit device.

(8) According to the seventh aspect of the present invention, since the main surface-side dividing trench is formed with the accuracy of the photolithography technique, the defective macrocell removed region or good macrocell can be made extremely high in dimensional accuracy and their sizes can be reproduced to a satisfactory extent. Moreover, by using the insulting layer as a stopper layer at the time of forming the back side dividing trench, it is possible to prevent the main surface-side dividing trench from being deteriorated in dimensional accuracy. That is, in forming the back side dividing trench, there is no deterioration in dimensional accuracy of both the defective macrocell removed region and the good macrocell. Consequently, when the good macrocell is disposed in the defective macrocell removed region, its positioning and mounting can be done in an extremely satisfactory manner. Further, since the processing accuracy of the back side dividing trench need not be as great as that of the main surface-side dividing trench, the former can be processed rougher (less precisely) than the latter, and accordingly there arises room for selection also with respect to the processing method. As a result, it becomes possible to greatly shorten the dividing trench forming time.

(9) According to the eight aspect of the present invention, by disposing a macrocell having a different circuit function in the chip region, it is possible to change or expand the logical function of the semiconductor integrated circuit, and hence it is possible to create a new product value.

While I have shown and described several embodiments in accordance with the present invention, it is understood that the same is not limited thereto, but is susceptible of numerous changes and modifications as known to one having ordinary skill in the art and I therefore do not wish to be limited to the details shown and described herein, but intend to cover all such modifications as are encompassed by the scope of the appended claims.

I claim:

1. A method for manufacturing a semiconductor integrated circuit device, comprising the steps of:
providing a semiconductor wafer having a semiconductor elements arranged in chip regions of the semiconductor wafer, the semiconductor wafer having a thickness;
forming primary wiring to interconnect the semiconductor elements, so as to form a plurality of macrocells in at least one of the chip regions;
without prior interconnecting the plurality of macrocells, testing electrical characteristics of the macrocells to determine whether any macrocells are defective;
after said testing, removing any defective macrocells, from the wafer, so as to form a macrocell removed region, the macrocell removed region extending only partially, and not fully, through the thickness of the semiconductor wafer;
after testing the macrocells to determine whether any macrocells are defective, forming secondary wiring to interconnect at least two of the plurality of macrocells with each other.

2. A method for manufacturing a semiconductor integrated circuit device according to claim 1, wherein after removing the defective macrocells and prior to said forming secondary wiring a good macrocell is fixed in the defective macrocell removed region; and wherein the step of forming the secondary wiring also interconnects the good macrocell with the plurality of macrocells.

3. A method for manufacturing a semiconductor integrated circuit device according to claim 2, wherein, in fixing said good macrocell in the defective macrocell removed region, an upper surface of the good macrocell is provided at a substantially same height as an upper surface of the macrocells surrounding the good macrocell.

4. A method for manufacturing a semiconductor integrated circuit device according to claim 3, wherein, in fixing said good macrocell in the defective macrocell removed region, a metal or a compound of a metal is embedded in a space between the good macrocell and surrounding macrocells, to fix the good macrocell; and thereafter an upper portion of said metal or compound of a metal, extending above said substantially same height, is removed such that an upper surface of said metal or compound of a metal is at said substantially same height.

5. A method for manufacturing a semiconductor integrated circuit device according to claim 3, wherein, in fixing said good macrocell in the defective macrocell removed region, an insulating material is provided (1) in a gap between the good macrocell and surrounding macrocells, and (2) on the good macrocell and surrounding macrocells; and thereafter the insulating material is provided with a flat upper surface.

6. A method for manufacturing a semiconductor integrated circuit device according to claim 5, wherein said semiconductor wafer includes a layer of semiconductor material, in which semiconductor regions of the semiconductor elements are provided, on an insulator.

7. A method for manufacturing a semiconductor integrated circuit device according to claim 1, wherein the plurality of macrocells in the at least one chip region are formed in a lattice pattern, and wherein in said testing electrical characteristics of the macrocells a plurality of macrocells, in a straight line in said lattice pattern, are tested simultaneously.

8. A method for manufacturing a semiconductor integrated circuit device according to claim 1, wherein wiring lines of the secondary wiring is formed to have a larger cross-sectional area than the cross-sectional area of wiring lines of the primary wiring.

9. A method for manufacturing a semiconductor integrated circuit device according to claim 1, wherein any defective macrocells are removed from the wafer and replaced with good macrocells, the good macrocells being obtained from said semiconductor wafer.

10. A method for manufacturing a semiconductor integrated circuit device according to claim 1, wherein said semiconductor wafer includes a layer of semiconductor material, in which semiconductor regions of the semiconductor elements are provided, on an insulator.

11. A method for manufacturing a semiconductor integrated circuit device according to claim 1, wherein the second trench is formed by a process having less accuracy than the process used for forming the first trench.

12. A method for manufacturing a semiconductor integrated circuit device according to claim 11, comprising the further step of replacing the defective macrocells, after the defective macrocells have been removed, with good macrocells, the step of replacing, for each defective macrocell, comprising sub-steps of forming a first trench surrounding a good macrocell provided on said semiconductor wafer and extending from an upper surface of the semiconductor wafer but not through the entire thickness of the semiconductor wafer; forming a second trench extending from a surface of the semiconductor wafer opposed to the upper surface, so as to meet the first trench such that the good macrocell can be removed from said semiconductor wafer; transferring the good macrocell to the position where the defective macrocell was removed, and fixing the good macrocell at the location where the defective macrocell was removed.

13. A method for manufacturing a semiconductor integrated circuit device according to claim 11, wherein the insulator is provided on a body, and wherein said second trench is formed by etching and extends through the body to the insulator, the insulator acting as an etching stop for said etching.

14. A method for manufacturing a semiconductor integrated circuit device according to claim 1, wherein each of the plurality of macrocells is surrounded by a first trench forming member extending from the upper surface of the layer of semiconductor material through the insulator, and the first trench forming member is removed in forming the first trench.

15. A method for manufacturing a semiconductor integrated circuit device, comprising the steps of:
providing a semiconductor wafer having semiconductor elements arranged in chip regions of the semiconductor wafer;
forming primary wiring to interconnect the semiconductor elements, so as to form a plurality of macrocells in at least one of the chip regions;
removing at least one of the macrocells of the plurality of macrocells, thereby forming a respective macrocell removed region for each removed macrocell;
replacing said at least one of the macrocells, at the respective macrocell removed region, with a different macrocell, said different macrocell having a different circuit function than said at least one of the macrocells, said different macrocell being positioned at said respective macrocell removed region; and
forming secondary wiring to interconnect the different macrocell and remaining ones of the plurality of macrocells.

16. A method for manufacturing a semiconductor integrated circuit device according to claim 15, wherein said removing at least one of the macrocells of the plurality of macrocells is performed without prior interconnecting of the plurality of macrocells.

17. A method for manufacturing a semiconductor integrated circuit device according to claim 15, wherein said different macrocell is an optical electronics integrated circuit.

18. A method for manufacturing a semiconductor integrated circuit device, comprising the steps of:
forming predetermined semiconductor integrated circuit elements in a chip region on a semiconductor wafer;
arranging a plurality of macrocells having the same circuit function regularly in said chip region by a primary wiring process;
arranging, regularly in each of the plurality of macrocells, test pads which are connected to a main circuit portion in the macrocell through a shift register circuit portion formed in the interior of the macrocell;
after arranging the test pads, converting check data which have been inputted in series through said test pads into parallel signals through the shift register circuit portion and inputting the parallel signals to the main circuit portion, so as to check electrical characteristics of each macrocell in the chip region;
converting detection data which have been outputted in parallel from the main circuit portion in accordance with said check data into serial signals through the shift register circuit portion and outputting the serial signals to the test pads;
comparing the detection data outputted to the test pads with an expected value to provide a judgment whether the macrocell is good or defective;
preparing macrocell quality information on the basis of results of said judgment;
removing a defective macrocell from the semiconductor wafer, on the basis of said macrocell quality information, thereby forming a defective macrocell removed region, the defective macrocell removed region not extending an entire thickness of the semiconductor wafer;
after removing a defective macrocell, embedding a good macrocell in the defective macrocell removed region; and
interconnecting the macrocells in the chip region by a secondary wiring process to form a predetermined semiconductor integrated circuit in the chip region.

19. A method for manufacturing a semiconductor integrated circuit device according to claim 18, wherein the macrocells in the chip region are interconnected by the secondary wiring process after embedding the good macrocell in the defective macrocell removed region, the good macrocell being interconnected with the macrocells in the chip region, by the secondary wiring process.

20. A method for manufacturing a semiconductor integrated circuit device according to claim 18, wherein said plurality of macrocells are arranged in the form of a lattice, in row and column directions, in said chip region; and, when checking electrical characteristics of each macrocell in the chip region, plural macrocells, arranged in a row or a column direction, are checked simultaneously.

21. A method for manufacturing a semiconductor integrated circuit device according to claim 18, wherein said good macrocell is obtained from said semiconductor wafer.

22. A method for manufacturing a semiconductor integrated circuit device according to claim 18, wherein in embedding the good macrocell in the defective macrocell removed region, an upper surface of the good macrocell and upper surfaces of macrocells surrounding the good macrocell are set at substantially a same height.

23. A method for manufacturing a semiconductor integrated circuit device according to claim 18, wherein at the time of embedding the good macrocell in the defective macrocell removed region, a metal or a compound thereof is buried between the good macrocell and macrocells surrounding the good macrocell, and thereafter the upper portion of the thus-buried metal or compound is flattened such that an upper surface of the thus-buried metal or compound is at substantially a same height as upper surfaces of the good macrocell and the surrounding macrocells.

24. A method for manufacturing a semiconductor integrated circuit device according to claim 18, wherein wiring lines interconnecting said macrocells, formed in the secondary wiring process, are made larger in sectional area than wiring lines formed in arranging the plurality of macrocells by the primary wiring process.

25. A method for manufacturing a semiconductor integrated circuit device according to claim 18, wherein the defective macrocell is removed in a direction extending away from a surface of the semiconductor wafer on which the chip region is provided.

26. A method for manufacturing a semiconductor integrated circuit device according to claim 18, wherein the semiconductor wafer has a front surface on which the chip region is provided, and a back surface opposite the front surface, and wherein the defective macrocell is removed in a direction extending away from the back surface of the semiconductor wafer.

27. A method for manufacturing a semiconductor integrated circuit device according to claim 10, wherein the semiconductor wafer has a structure of an insulating layer between semiconductor layers; then on the basis of the results of said judgment, said first trench is formed in an outer periphery of a defective macrocell by lithography; further, said second trench is formed, such that the defective macrocell can be removed from the wafer; and after taking out the defective macrocell a good macrocell is disposed in the defective macrocell removed region and fixed therein.

28. A method for manufacturing a semiconductor integrated circuit device according to claim 27, wherein the good macrocell is provided, in order to be disposed in the defective macrocell removed region, by steps of providing a good macrocell in said semiconductor wafer, on a main surface thereof; forming a good macrocell main surface-side dividing trench extending from the main surface of said semiconductor wafer into the wafer through the insulating layer, surrounding the good macrocell, the good macrocell main surface-side dividing trench being formed by lithography; and forming a good macrocell back-side dividing trench extending from a back surface of the semiconductor wafer, opposite the main surface, up to the good macrocell main surface-side dividing trench such that the good macrocell can be removed from the semiconductor wafer.

29. A method for manufacturing a semiconductor integrated circuit device according to claim 27, wherein the good macrocell is provided, in order to be disposed in the defective macrocell removed region, by steps of providing a good macrocell in another semiconductor wafer having a structure of an insulating layer between semiconductor layers, the another semiconductor wafer having a main surface on which the good macrocell is provided and a back surface opposite the main surface; forming a good macrocell main surface-side dividing trench extending from the main surface of said another semiconductor wafer into the wafer through the insulating layer, surrounding the good macrocell, the good macrocell main surface-side dividing trench being formed by lithography; and forming a good macrocell back-side dividing trench extending from the back surface of the semiconductor wafer up to the good macrocell main surface-side dividing trench such that the good macrocell can be removed from the another semiconductor wafer.

30. A method for manufacturing a semiconductor integrated circuit device, comprising the steps of:
forming predetermined semiconductor integrated circuit elements in a chip region on a semiconductor wafer;
arranging a plurality of macrocells having the same circuit function regularly in said chip region by a primary wiring process;
forming, regularly in each of said plurality of macrocells, test pads which are connected to a main circuit portion in the macrocell through a shift register circuit portion formed in the interior of the macrocell;
after forming the test pads, converting check data which have been inputted in series through said test pads into parallel signals through the shift register circuit portion and inputting the parallel signals to the main circuit portion, so as to check electrical characteristics of the macrocells in the chip region;
converting detection data which have been outputted in parallel from the main circuit portion in accordance with said check data into serial signals through the shift register circuit portion and outputting the serial signals to the test pads;
preparing macrocell information on the basis of the outputted detection data;
removing a defective macrocell on the basis of said macrocell information, to thereby form a macrocell removed region;
embedding a macrocell having a different circuit function than a circuit function of the defective macrocell in the macrocell removed region; and
interconnecting the macrocells in the chip region by a secondary wiring process to form a predetermined semiconductor integrated circuit in the chip region.

31. A method for manufacturing a semiconductor integrated circuit device according to claim 1, wherein the macrocell removed region is a surface region of the semiconductor wafer, extending a sufficient depth from a surface of the wafer so as to remove semiconductor elements forming the defective macrocells.

32. A method for manufacturing a semiconductor integrated circuit device according to claim 1, wherein the semiconductor wafer includes at least one defective macrocell, which is removed in said removing step.

33. A method for manufacturing a semiconductor integrated circuit device according to claim 1, wherein after the removing step, good macrocells are provided in the macrocell removed region.

34. A method for manufacturing a semiconductor integrated circuit device according to claim 1, wherein said removing any defective macrocells so as to form the macrocell removed region is performed by irradiating the defective macrocells with a focussed ion beam.

35. A method for manufacturing a semiconductor integrated circuit device according to claim 2, wherein the good macrocell has a thickness the same as that of the depth of the macrocell removed region.

36. A method for manufacturing a semiconductor integrated circuit device, comprising the steps of:
providing a semiconductor wafer having semiconductor elements arranged in chip regions of the semiconductor wafer;
forming primary wiring to interconnect the semiconductor elements, so as to form a plurality of macrocells in at least one of the chip regions;
without prior interconnecting the plurality of macrocells, testing electrical characteristics of the macrocells to determine whether any macrocells are defective;
removing any defective macrocells, by forming a first trench surrounding defective macrocells and extending from an upper surface of the semiconductor wafer but not through an entire thickness of the wafer, and forming a second trench extending from a surface of the wafer opposed to the upper surface, so as to meet the first trench such that the defective macrocells can be removed from the semiconductor wafer; and after testing the macrocells to determine whether any macrocells are defective, forming secondary wiring to interconnect at least two of the plurality of macrocells with each other.

37. A method for manufacturing a semiconductor integrated circuit device according to claim 36, wherein the semiconductor wafer includes at least one defective macrocell, which is removed in said removing step.

38. A method for manufacturing a semiconductor integrated circuit device according to claim 36, wherein the semiconductor wafer includes a layer of semiconductor material, in which semiconductor regions of the semiconductor elements are provided, on an insulator.

39. A method for manufacturing a semiconductor integrated circuit device according to claim 15, wherein the macrocell removed regions do not extend an entire thickness of the semiconductor wafer.

40. A method for manufacturing a semiconductor integrated circuit device, comprising the steps of:

forming predetermined semiconductor integrated circuit elements in a chip region on a semiconductor wafer;

arranging a plurality of macrocells having the same circuit function regularly in said chip region by a primary wiring process;

arranging, regularly in each of the plurality of macrocells, test pads which are connected to a main circuit portion in the macrocell through a shift register circuit portion formed in the interior of the macrocell;

after arranging the test pads, converting check data which have been inputted in series through said test pads into parallel signals through the shift register circuit portion and inputting the parallel signals to the main circuit portion, so as to check electrical characteristics of each macrocell in the chip region;

converting detection data which have been outputted in parallel from the main circuit portion in accordance with said check data into serial signals through the shift register circuit portion and outputting the serial signals to the test pads;

comparing the detection data outputted to the test pads with an expected value to provide a judgment whether the macrocell is good or defective;

preparing macrocell quality information on the basis of results of said judgment;

removing a defective macrocell on the basis of said macrocell quality information, thereby forming a defective macrocell removed region, the step of removing the defective macrocell including substeps of forming a first trench surrounding defective macrocells and extending from an upper surface of the semiconductor wafer but not through an entire thickness of the wafer, and forming a second trench extending from a surface of the wafer opposed to said upper surface, so as to meet the first trench such that the defective macrocells can be removed from the semiconductor wafer;

after removing a defective macrocell, embedding a good macrocell in the defective macrocell removed region; and interconnecting the macrocells in the chip region by a secondary wiring process to form a predetermined semiconductor integrated circuit in the chip region.

41. A method for manufacturing a semiconductor integrated circuit device according to claim 30, wherein the macrocell removed regions do not extend an entire thickness of the semiconductor wafer.

42. A method for manufacturing a semiconductor integrated circuit device, comprising the steps of:

providing a semiconductor wafer having semiconductor elements arranged in chip regions of the semiconductor wafer, the semiconductor wafer having a thickness;

forming primary wiring to interconnect the semiconductor elements, so as to form a plurality of macrocells in at least one of the chip regions;

removing semiconductor elements from a region of the semiconductor wafer so as to form a macrocell removed region, the macrocell removed region not extending the thickness of the semiconductor wafer; and thereafter, forming secondary wiring to interconnect at least two of the plurality of macrocells with each other.

43. A method for manufacturing a semiconductor integrated circuit device according to claim 42, including the further step of fixing a good macrocell in the macrocell removed region.

44. A method for manufacturing a semiconductor integrated circuit device according to claim 43, wherein said step of fixing the good macrocell is performed after removing semiconductor elements and prior to forming the secondary wiring, and wherein the step of forming the secondary wiring interconnects the good macrocell with the plurality of macrocells.

45. A method for manufacturing a semiconductor integrated circuit device, comprising the steps of:

providing a semiconductor wafer having semiconductor elements arranged in chip regions of the semiconductor wafer;

forming primary wiring to interconnect the semiconductor elements, so as to form a plurality of macrocells in at least one of the chip regions;

removing semiconductor elements from a region of the semiconductor wafer so as to form a macrocell removed region, said removing including forming a first trench surrounding semiconductor elements to be removed and extending from an upper surface of the semiconductor wafer but not through an entire thickness of the wafer, and forming a second trench extending from a surface of the wafer opposed to said upper surface, so as to meet the first trench such that the semiconductor elements to be removed can be removed from the semiconductor wafer.

* * * * *